United States Patent [19]

Ikeda

[11] Patent Number: 5,184,131

[45] Date of Patent: Feb. 2, 1993

[54] A-D CONVERTER SUITABLE FOR FUZZY CONTROLLER

[75] Inventor: Hiroshi Ikeda, Yokohama, Japan

[73] Assignee: Nissan Motor Co., Ltd., Yokohama, Japan

[21] Appl. No.: 540,591

[22] Filed: Jun. 20, 1990

[30] Foreign Application Priority Data

Jul. 6, 1989 [JP] Japan .................................. 1-172961
Jul. 6, 1989 [JP] Japan .................................. 1-172962
Jul. 6, 1989 [JP] Japan .................................. 1-172963

[51] Int. Cl.⁵ ......................................... H03M 1/38
[52] U.S. Cl. ................................. 341/165; 341/160
[58] Field of Search ............... 341/147, 160, 164, 165

[56] References Cited

U.S. PATENT DOCUMENTS

| 3,678,501 | 7/1972 | Prill | 341/165 |
| 4,415,882 | 11/1983 | Akazawa et al. | 341/156 |
| 4,498,072 | 2/1985 | Moriyama | 340/347 |
| 5,012,246 | 4/1991 | Chung et al. | 341/160 |
| 5,016,014 | 5/1991 | Bitting | 341/162 |

OTHER PUBLICATIONS

Watanabe et al, "A VLSI Fuzzy Logic Controller ...", IEEE Journal of Solid State Circuits, vol. 25, No. 2, Apr. 1990, pp. 376–381.

M. Mizumoto, "Fuzzy Controls Under Various ...", International Workshop on Fuzzy System Appln., 1990, pp. 252–253.

Nikkan Kogyo SHINBUN, "A-D, D-A Conversion Technique in Microcomputer Age", pp. 70–79.

Nikkei Electronics 1988, 10, 3 (No. 457), pp. 157–168.

*Primary Examiner*—Marc Hoff
*Attorney, Agent, or Firm*—Foley & Lardner

[57] ABSTRACT

In an A-D converter including a reference voltage generator, a D-A converter for outputting analog reference comparison voltage signals in response to digital signals; a comparator for comparing the voltages with an analog input voltage signal to be converted and outputting a reset signal when the voltage is substantially equal to the voltage, and a successive approximation register for successively outputting the digital signals to the D-A converter and an A-D converted signal in response to the reset signal, the D-A converter comprises in particular, at least one decoder block composed of plural array switches for coding any given function. Therefore, the analog input signal can be converted into the corresponding digital output signal in accordance with the coded function, thus providing an A-D converter suitable for use with a fuzzy controller. Further, the reference voltage generator is so configured as to easily change the coded membership function symmetrically or asymmetrically. A comparator priority decision logic circuit is further incorporated to allow input signals to be converted into output voltages in sequence in accordance with a multivalued membership function.

13 Claims, 16 Drawing Sheets

| DIGITAL INPUTS | ANALOG OUTPUTS |
|---|---|
| MSB         LSB | |
| 1 1 1 1 1 1 1 1 | $-V_{REF}\left(\frac{255}{256}\right)$ |
| 1 0 0 0 0 0 0 1 | $-V_{REF}\left(\frac{129}{256}\right)$ |
| 1 0 0 0 0 0 0 0 | $-V_{REF}\left(\frac{128}{256}\right) = -\frac{V_{REF}}{2}$ |
| 0 1 1 1 1 1 1 1 | $-V_{REF}\left(\frac{127}{256}\right)$ |
| 0 0 0 0 0 0 0 1 | $-V_{REF}\left(\frac{1}{256}\right)$ |
| 0 0 0 0 0 0 0 0 | $-V_{REF}\left(\frac{0}{256}\right) = 0$ |

Note : $1 LSB = (2^{-8})(V_{REF}) = \left(\frac{1}{256}\right)(V_{REF})$

FIG.14 (C)
PRIOR ART

| ANALOG INPUT VOLTAGE (Vin) | DIGITAL OUTPUT VOLTAGE (Vout) |
|---|---|
| (7/8) FSR OR MORE | [1 1 1] |
| (7/8) ~ (6/8) | [1 1 0] |
| (6/8) ~ (5/8) | [1 0 1] |
| (5/8) ~ (4/8) | [1 0 0] |
| (4/8) ~ (3/8) | [0 1 1] |
| (3/8) ~ (2/8) | [0 1 0] |
| (2/8) ~ (1/8) | [0 0 1] |
| (1/8) FSR OR LESS | [0 0 0] |

IF ( )FSR < Vin    "0" DOES NOT RESET REG(500B) AND REG (500A) IS SHIFTED TO INCREASE $V_A$

IF ( )FSR > Vin    "1" RESETS MSB OF REG (500B) TO DECREASE $V_A$

A-D CONVERTER SUITABLE FOR FUZZY CONTROLLER

BACKGROUND OF THE INVENTION

1. Field of the Invention

The present invention relates to an analog-to-digital (A-D) converter suitable for a fuzzy controller, and more specifically to a successive approximation A-D converter suitable for use with a fuzzy control system.

2. Description of the Prior Art

There exist various analog-to-digital (A-D) converters. FIG. 1(A) shows a successive approximation (voltage comparison) A-D converter and FIG. 1(B) shows a successive approximation (current comparison) A-D converter, by way of example, which are of medium conversion speed type (several to several hundred microseconds) and suitable for high integration circuit, because the number of elements is relatively small.

In these drawings, the A-D converter roughly comprises a reference voltage generator 100, a D-A converter 200, a comparator 300, a controller 400, and a successive approximation register 500.

The D-A converter 200 converts a reference voltage $V_{ref}$ from the reference voltage generator 100 into a plurality of successively changing analog voltages $V_A$ in response to successively changing digital (m-bit) signals $V_D$ outputted from the successive approximation register 500. The successively changing analog voltages $V_A$ generated from the D-A converter 200 are compared with an analog input signal $V_{in}$ to be converted through the comparator 300. When one of the voltages $V_A$ generated from the D-A converter 200 is equal to or higher than the input signal $V_{in}$ ($V_A - V_{in} > 0$), the controller 400 outputs a reset signal $S_R$ to the successive approximation register 500 to determine one of the successively changing digital voltages $V_D$ as an A-D converted signal corresponding to the analog input signal $V_{in}$. The above prior-art A-D converter is disclosed in "A-D, D-A CONVERSION TECHNIQUE IN MICROCOMPUTER AGE" page 75, published by NIKKAN KOGYO SHINBUN.

The fuzzy control system will be summarized hereinbelow. The concept of "fuzziness" has come about by considering what and how human beings think and how they communicate with one other. L. A. Zadeh proposed the concept of fuzzy sets in 1965. Research on fuzziness emphasizes that human knowledge is based on accumulated experience which can be generalized in the form of linguistic information such as know-how processed by specialists. This linguistic information generally proposed vagueness, obscurity, uncertainty, incompleteness or impreciseness, etc. represented by membership functions. The grade or value of the membership function is expressed by an actual numerical value (e.g. 0.7) lying between a region from "1" (YES) or "0" (NO). The fuzzy control is suitable for controlled objects difficult to be expressed by mathematical models.

With reference to FIG. 2, a fuzzy inference is executed in accordance with a plurality of rules expressed in the form of "if - then" rules as follows:

If $x_1 = A_{11}$ and $x_2 = A_{12}$, then $y = A_{13}$

If $x_1 = A_{21}$ and $x_2 = A_{22}$, then $y = A_{23}$ (e.g. if $x_1$ = BIG and $x_2$ = NORMAL, then $y$ = SMALL)

The above "if $x_1 = A_{11}$ and $x_2 = A_{12}$" or "if $x_1 = A_{21}$ and $x_2 = A_{22}$" is referred to as "antecedent" which indicates the conditions that the rules can be established, and "then $y = A_{13}$ or $y = A_{23}$" is referred to as "consequent" which indicates the inferred result. The above $x_i$ are input signals (variables) generated by sensors for instance and y is referred to as an output control signal (variable) applied to an actuator for instance. Further, the above Aij are linguistic information or membership functions which define fuzzy rule propositions as follows:

NL: Negative Large
NM: Negative Medium
NS: Negative Small
ZR: Zero
PS: Positive Small
PM: Positive Medium
PL: Positive Large The membership functions represent grades to which the input variables belong to a fuzzy set, and any given functions can be adopted for the membership functions. The membership functions of the antecedent can be formed into any given forms (such as normal distribution, triangular, singleton, etc.). The function value (grade) of the membership function lies within a range between $g=1$ and $g=0$, as already explained. Here, if two input signals (defuzzified value) $x_1^o$ and $x_2^o$ are given, each grade g can be obtained in accordance with each membership function. FIG. 2, shows an example of a fuzzy inference process, in which triangular membership functions are shown for simplification. When an input $x_1^o$ is given, a function value $gT_{11}$ of the membership function $A_{11}$ can be obtained. In the same way, a function value $gT_{12}$ of the membership function $A_{12}$ can be obtained. Then, a MIN operation for selecting the smallest (smaller, in this example) one is executed for the above two function values $gT_{11}$ and $gT_{12}$. The executed MIN operation result is expressed as $gT_{11}$.

Similarly, when the input $x_1^o$ is given, a function value $gT_{21}$ of the membership function $A_{21}$ can be obtained. In the same way, a function value $gT_{22}$ of the membership function $A_{22}$ can be obtained. Then a MIN operation is executed for these two functions values $gT_{21}$ and $gT_{22}$. The executed MIN operation result is expressed as $gT_{22}$.

A truncation between the obtained MIN operation result $gT_{11}$ and the membership function $A_{13}$ of the consequent of the rule 1 is executed to obtain a membership function $y_1$ as shown by a shaded portion in FIG. 2. Similarly, a truncation between the obtained MIN operation result $gT_{22}$ and the membership function $A_{23}$ of the consequent of the rule 2 is executed to obtain a membership function $y_2$ as shown by a shaded portion in FIG. 2.

A MAX operation for selecting the largest (larger, in this example) one is executed for the above two inferred results $y_1$ and $y_2$ to obtain a final defuzzified value. A final defuzzified value can be obtained by defuzzifying the final inferred (fuzzified) results by calculating a center of gravity thereof, for instance. The final defuzzified value is outputted as an output (defuzzified value) $y_0$. Further detailed description is disclosed in NIKKEI ELECTRONICS No. 457, page 160, 1988 or by H. WATANABE et al "A VLSI Fuzzy Logic Controller with Reconfigurable, Cascadable Architecture" IEEE JOURNAL OF SOLID-STATE CIRCUITS, VOL. 25, No. 2, APRIL 1990.

Further, there exists the other method of obtaining the above-mentioned defuzzified value $Y_0$. An example thereof is to calculate an average value as follows:

$$y_0 = \frac{gT_1 y_1 + gT_2 y_2}{gT_1 + gT_2} \quad (1)$$

where gT denotes the minimum grade value of the antecedents of each rule and y denotes the value obtained when g=1 in the consequent membership function of each rule. This method is disclosed by M. Mizumoto "FUZZY CONTROLS UNDER VARIOUS DEFUZZIFIER METHODS", International Workshop on Fuzzy System Application, pages from 252 to 253, 1988.

FIGS. 3(A) and 3(B) show prior-art fuzzy controllers by way of example, in each of which the successive approximation A-D converters as explained already are incorporated with a fuzzy processor chip. In these fuzzy controllers, analog input signals A to D are converted into 6-bit digital signals; these digital signals are fuzzy-inferred by the fuzzy logic processor SRAM (static random access memory) in FIG. 3(A) or EPROM (erasable programmable read only memory) in FIG. 3(B); and 4-bit inferred results are converted again from digital to analog signals X and Y.

In other word, in the conventional fuzzy controller as described above, in spite of the fact that analog signals are usually inputted and outputted, since the signals are fuzzy-inferred by digital method, there exists a problem in that the scale of chip becomes large in size and further the actual inference speed is low and therefore the inference time (from when analog signals are inputted to when analog signal are outputted) is long. On the other hand, when the overall system is configured by analog circuits, it may be possible to simplify the circuit configuration. In this case, however, there exist other problems in that the analog system configuration is inferior to the digital system configuration in controller reliability, stability against noise, large-scale integration, low power consumption rate, etc.

Further, "Fuzzy controller" is disclosed in further detail in NIKKEI ELECTRONICS No. 457, on pages 157 to 168, 1988.

SUMMARY OF THE INVENTION

With these problems in mind, therefore, it is the primary object of the present invention to provide a analog-to-digital converter suitable for use with a fuzzy controller.

To achieve the above-mentioned object, the A-D converter according to the present invention, comprises: (a) reference voltage generating means (10) for generating a plurality of different analog reference comparison voltages ($V_A$); (b) decoder means (20) connected to said reference voltage generating means and including at least one decoder block ($21_n$) composed of plural array switches (22), for decoding a function coded by an arrangement of array switches to output the analog reference comparison voltages ($V_A$) in response to digital signals in accordance with the coded function; (c) at least one comparator means (30) connected to said decoder means, for comparing the outputted analog reference comparison voltage ($V_A$) with a voltage ($V_{in}$) of an analog input signal to be converted and outputting a reset signal ($S_R$) when the analog reference comparison voltage ($V_A$) is substantially equal to the analog input signal voltage ($V_{in}$); and (d) approximation register means (50) connected to said at least one comparator and to said decoder means, for successively outputting the digital signals (51S) to said decoder means to successively output the different analog reference comparison voltages ($V_A$) to said comparator in accordance with the function and for outputting an A-D converted signal in response to the reset signal from said comparator.

The reference voltage generating means (10) comprises: (a) at least three reference voltage input terminals (12a, 12b, 12c) for supplying first, second and third reference voltages; (b) an adder (11a) for adding the first and second reference voltages supplied through said first and second input terminals (12a, 12b) to supply a highest reference voltage (15a); (c) a buffer (11b) for directly supplying the second reference voltage (15b); (d) a subtracter (11c) for subtracting the third reference voltage from the second reference voltage to supply a lowest reference voltage (15c); (e) a first series-connected voltage dividing resistors ($R_{a1}$ to $R_{an}$) connected between two outputs of said adder and said buffer, for supplying a plurality of analog reference comparison voltages $16_{a1}$ to $16_{an}$); and (f) a second series-connected voltage dividing resistors ($R_{b1}$ to $R_{bn}$) connected between two outputs of said buffer and said subtracter, for supplying a plurality of different analog reference comparison voltages ($16_{b1}$ to $16_{bn}$) in symmetrical voltage distribution relationship with respect to the second reference voltage. The decoder switch array block ($21_n$) comprises: (a) first parallel-arranged lines ($10_{an}$) connected to different analog reference comparison voltages, respectively; (b) second parallel-arranged lines ($21_{na}$) intersecting said first parallel-arranged lines and connected to said approximation register means to input the plural digital signals; and (c) decoder switches (22) arranged at predetermined intersections between said first and second lines, for outputting different analog reference comparison voltages ($V_A$) in accordance with the coded function when said decoder switches are turned on in response to the digital signals (51S) from said approximation register means.

Further, when said comparator means comprises a plurality of comparators each for comparing analog reference comparison voltage ($V_A$n) decoded in accordance with a single-valued portion of a multivalued function with an analog input signal ($V_{in}$), an OR gate (31) is further connected to said plural comparators to output an ORed reset signal ($R_S$) to said approximation register means. Further, the A-D converter further comprises a comparator priority decision logic circuit (70, 70A) connected between said plural comparators and said OR gate, for deciding a priority among said plural comparators on the basis of output signals from said plural comparators, when plural analog input signals ($V_{in}$) are converted in sequence into digital output signals in accordance with a multivalued function.

In the A-D converter according to the present invention, since the A-D converter itself is so configured that fuzzy-inferred results can be directly obtained as digital output signals in accordance with membership functions in response to analog input signals, it is possible to extremely simplify the fuzzy controller configuration, increase the fuzzy inference speed, and decrease the power consumption rate.

Further, since the reference voltage generating means and the decoder means according to the present invention are both so configured that the membership functions coded by an arrangement of array switches can be easily changed symmetrically or asymmetrically by changing three reference voltages applied to three input terminals and the positions of the array switches, it is possible to convert analog signals into digital signals in accordance with any given membership functions for fuzzy rules.

Further, since two comparators, an OR gate, and a comparator priority decision logic circuit are incorporated, it is possible to convert analog signals into digital signals in sequence in accordance with any given two-valued membership functions. Further, the above-mentioned features can be expanded to a multivalued membership function by increasing the numbers of reference voltage terminals and the comparators to be incorporated in the A-D converter of the present invention.

DETAILED DESCRIPTION OF THE PREFERRED EMBODIMENTS

The embodiments of the present invention will be described hereinbelow with reference to the attached drawings. The feature of the A-D converter according to the present invention is to output signals ($V_{out}$) or fuzzy grades (g) directly in digital fashion in accordance with various (membership) functions when analog input signals ($V_{in}$) or input variables ($x_1^o$, $x_2^o$) are applied thereto.

Figure 4:
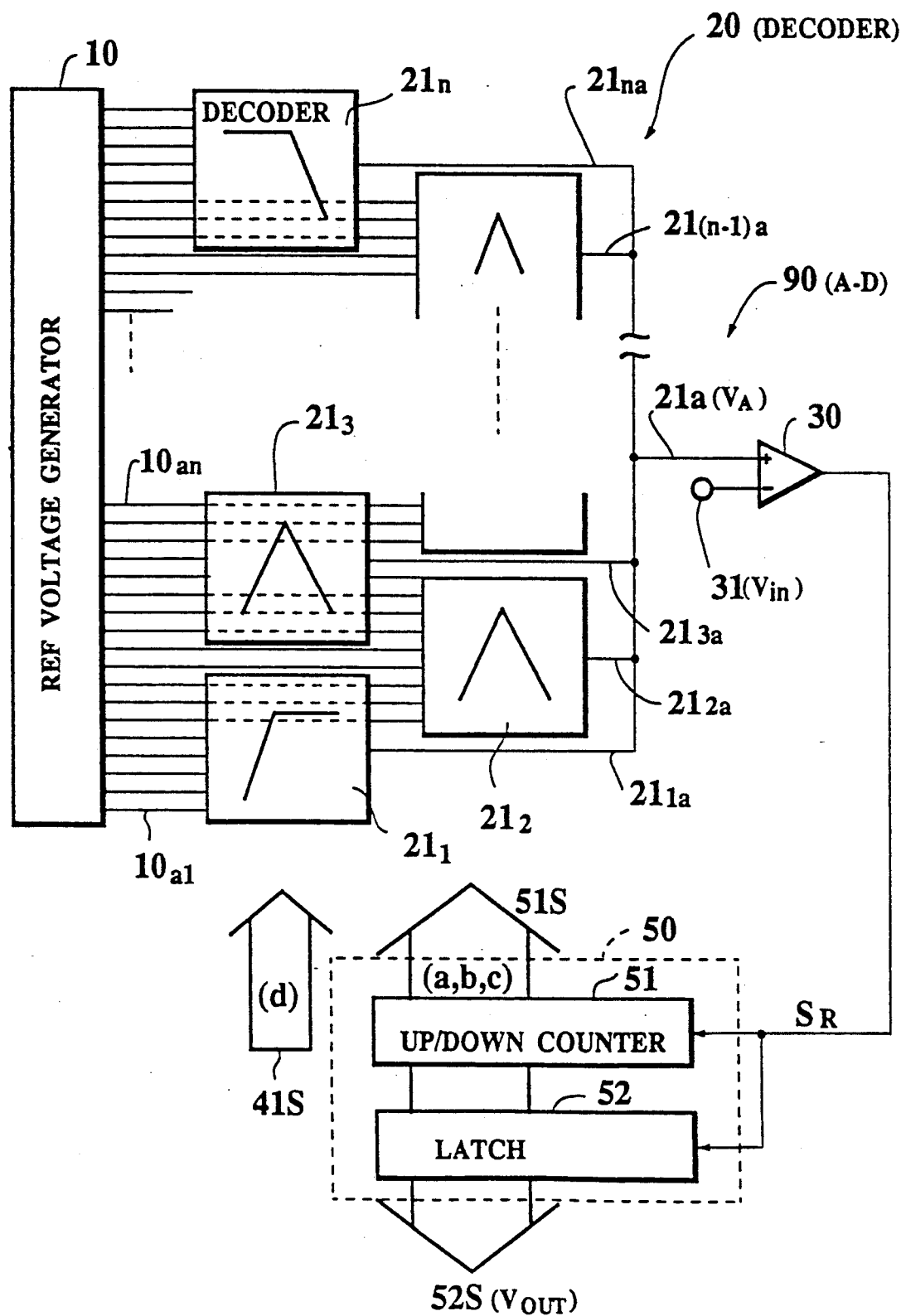
FIG. 4 is a block diagram showing an A-D converter according to the present invention.

FIG. 4 is a block diagram showing a first embodiment of the A-D converter 90 according to the present invention, which comprises a reference voltage generator 10 for generating a plurality of reference comparison voltages $10_{a1}$, --- $10_{an}$ ---, a decoder 20 including a plurality of decoder switch array blocks $21_1$ - $21_n$, a comparator 30, and an approximation register 50 including an up/down counter 51 and an output latch circuit 52. Further, in FIG. 4, the numerals $21_a$ ($21_{1a}$, --- $21_{na}$) denote reference comparison voltages ($V_A$) transmitted through the array blocks 21, respectively; 41S (d) denotes an array block select digital signal outputted from a controller (not shown); 51S (a, b, c) denotes a digital decoding signal (a, b, c); 31 ($V_{in}$) denotes an analog signal to be converted; and 52S ($V_{out}$) denotes an A-D converted signal.

Figure 5:
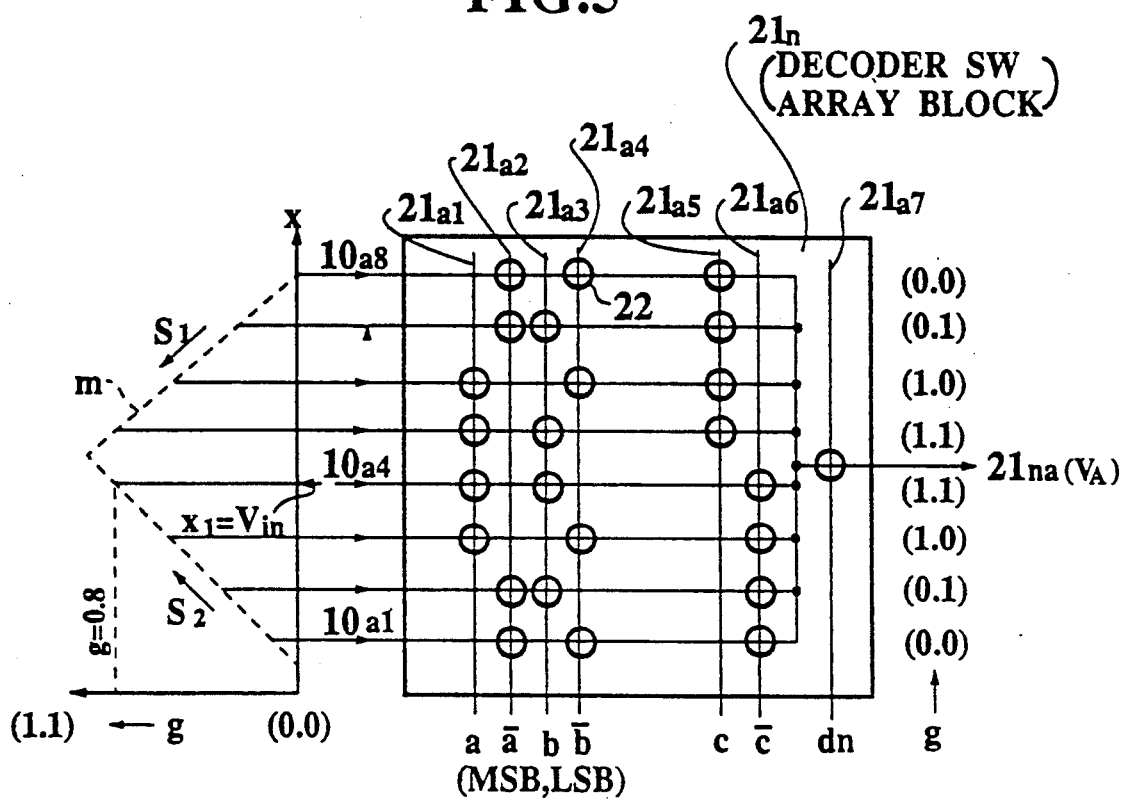
FIG. 5 is an illustration showing a decoder switch array block composed of decoder array switches and a function (m) showing the relationship between analog values (x) and digital values (g)

With reference to FIG. 5, a membership function m is shown on the left side, in which (x) denotes an input variable and (g) denotes a fuzzy grade lying between (1.1) and (0.0). Further, a decoder switch array block $21_n$ comprises horizontal lines $10_{a1}$ to $10_{a8}$ and vertical lines $21_{a1}$ to $21_{a7}$. A plurality of small circles denote array switches 22, and a plurality of intersections between the horizontal and vertical lines indicate that each reference comparison voltage $10_{an}$ can be passed along the horizontal line. A more detailed construction of these array switches 22 will be described hereinafter with reference to FIG. 12.

When a bit (a) of the digital signal 51S is at "1", four array switches encircled on the vertical line $21_{a1}$ are turned on; when the bit (a) is at "0", four array switches on the vertical lines $21_{a2}$ are turned on; when a bit (b) is at "1", four array switches on the vertical line $21_{a3}$ are turned on; when the bit (b) is at "0", four array switches on the vertical lines $21_{a4}$ are turned on. Further, when a bit (c) is at "1", an upper half of the triangular membership function can be selected; when at "0", a lower half thereof can be selected; and when the array block select signal 41S (dn) is at "1", the array block $21_n$ can be selected. Therefore, four different fuzzy grades (g) or four reference comparison voltages ($V_A$) can be selected through the horizontal line $21_{na}$ by the two bits (a, b) of the digital signal 51S. However, it is also possible to code any given membership functions (trapezoid, normal distribution, parabola etc.) by changing the grade values (reference comparison voltage values), arbitrarily.

Further, when the number of levels of the membership functions is seven, it is possible to code seven membership functions such as NL (Negative large), NM (Negative medium), NS (Negative small), ZR (Zero), PS (Positive small), PM (Positive medium) and PL (Positive large), for instance by modifying the arrangements of array switches 22, as shown by $21_1$, $21_2$ --- $21_7$ in FIG. 4.

The up/down counter 51 outputs three bit decode signals 51S (a, b, c) to a array switch block $21_n$ selected by the block select signal 41S (d) successively in the order of (0.0), (0.1), (1.0) and (1.1) when incremented, and the same signals successively in the order of (1.1), (1.0), (0.1) and (0.0) when decremented. These decode signals from (0.0) to (1.1) determine each reference comparison voltage ($V_A$) corresponding to each grade value g in accordance with the membership function m. Further, this up/down counter 6 is reset by the "1" reset signal $S_R$ outputted from the comparator 30, and further the latch circuit 6 latches the counter-reset value as a digital output signal ($V_{out}$) corresponding to the analog input signal ($V_{in}$).

In FIG. 4, the comparator 30 compares the decoded reference comparison voltage ($V_A$) with an analog input signal ($V_{in}$) applied to an inversion terminal 31 of the comparator 30. If $V_A > V_{in}$, the comparator 30 outputs a "1" reset signal. However, if $V_A < V_{in}$, the comparator outputs a "0" reset signal.

The operation of the A-D converter 90 according to the first embodiment will be described hereinbelow.

The reference voltage generator 10 generates a plurality of reference comparison voltages through the horizontal lines $10_{a1}$ --- $10_{an}$ --- to a plurality of decoder switch array blocks $21_1$ to $21_n$. In FIG. 4, the same reference comparison voltages are supplied to the plural switch array blocks because there exist the same function values (the reference comparison voltages $V_A$) between the membership functions. Any one of the switch array block $21_n$ is selected by a block select signal 51S (d) supplied from an external circuit (e.g. a microcomputer) and a three-bit decode signal 51S (a, b, c) is incremented by the up/down counter 51 and supplied to the selected decoder block $21_n$. As already described, the one-bit signal (c) selects one half of the two-valued membership function, and the two-bit signal (a, b) selects a grade (function value) g of the membership function m. For instance, when (a) = "1"; (b) = "1"; (c) = "0"; and (dn) = "1", g = 0.8 is decoded by these bit signals (a, b, c, d), and the reference comparison voltage $V_A$ corresponding to g = 0.8 is supplied to the comparator 30 through the horizontal line $21_{na}$. Since the digital signal 51S (a, b) is incremented by the up/down counter 51, for instance. When the reference comparison voltage $V_A$ (g = 0.8) exceeds an analog input signal $x_1^0$ ($V_{in}$), the comparator 30 outputs a "1" reset signal to the up/down counter 51 and the latch circuit 52 to reset the up/down counter 51 and latch the current counted value (a, b) = (1,1). The latched value (1,1) is outputted as a digital output signal ($V_{out}$) corresponding to an analog input signal $x_1^0$ ($V_{in}$).

Figure 6:
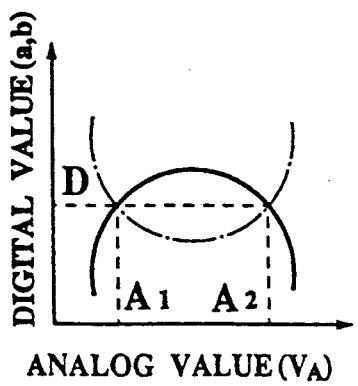
FIG. 6(A) is a graphical representation showing examples of two-valued functions.
FIG. 6(B) is a graphical representation showing an example of multivalued functions.
Figure 6:
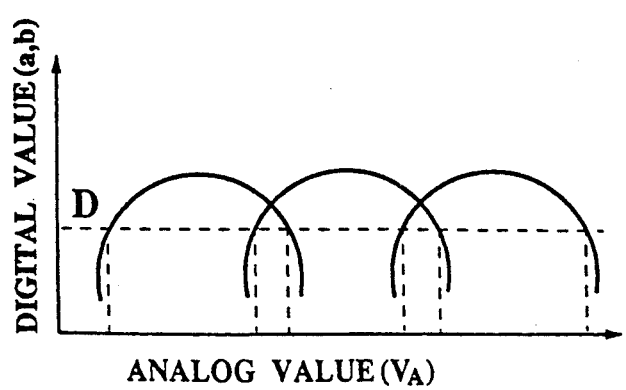

The above-mentioned decoder switch array block $21_n$ can be provided with the characteristics of a two-valued function as shown in FIG. 6 (A) or those of a multivalued function having overlapped function values as shown in FIG. 6 (B) by increasing the number of block selecting bits 41S (d). Further, any other membership functions of any shapes such as normal distributions, semicircular curves, polygonal lines, parabolic curves of multivalued functions can be decoded by the decoder 20 in the same way. Further, when a plurality of membership functions more than sever are required, the corresponding number of decoder blocks ca be coded. Alternatively, it is also possible to construct the decoder block by an erasable programmable read only memory (EPROM).

Figure 7:
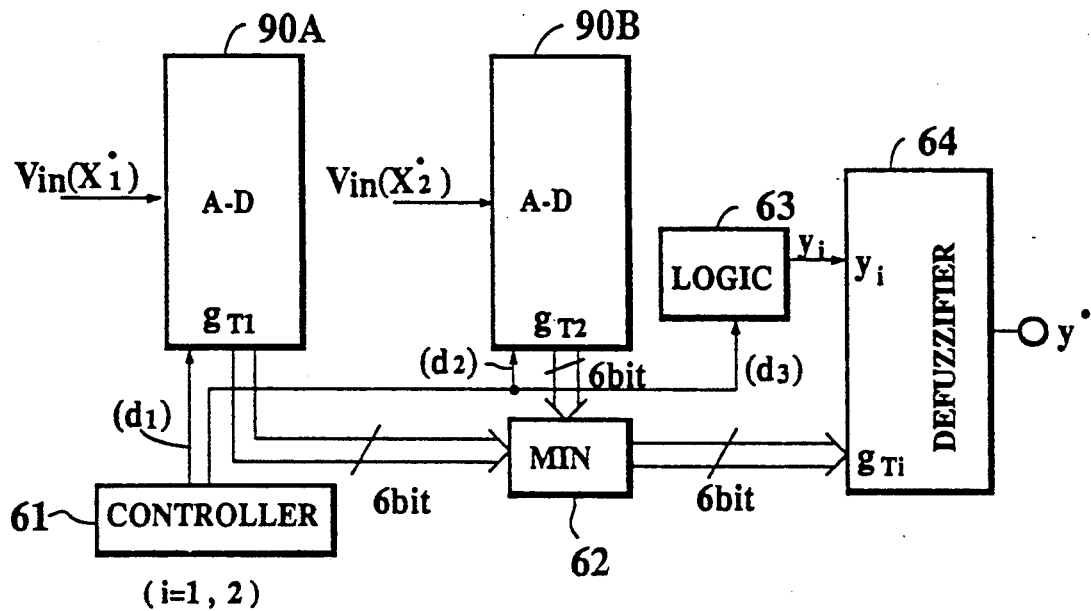
FIG. 7(A) is a block diagram showing an example of a fuzzy controller to which the A-D converters according to the present invention are applied.
FIG. 7(B) is a block diagram showing another example of a fuzzy controller to which the A-D converters according to the present invention are applied.
Figure 7:
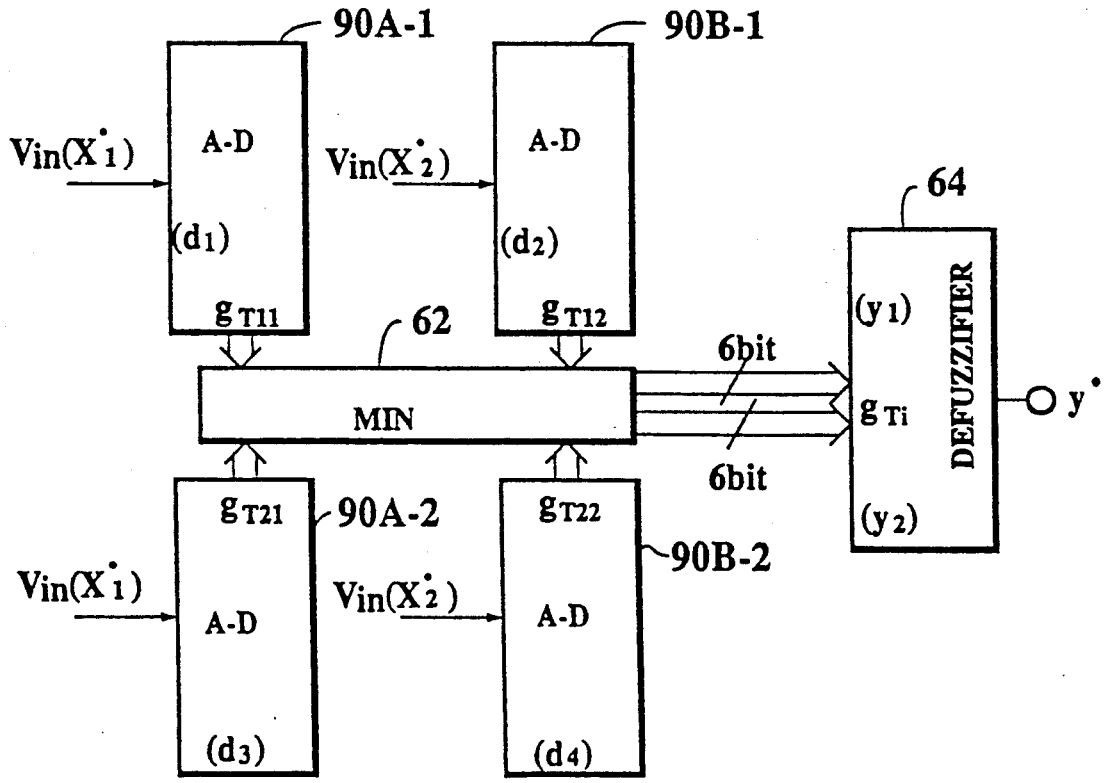

FIG. 7(A) shows an example of fuzzy processors or fuzzy chips to which A-D converters 10A and 10B according to the present invention are applied. In this example, two A-D converters for a single rule are provided, so that fuzzy inference operations in accordance with other rules are executed in time-sharing fashion. The fuzzy processor shown in FIG. 7(A) comprises two A-D converters 91A and 90B, a MIN operation section 62, a controller 61, logic circuit 63 and a defuzzifier 64.

Two analog input signals $V_{in}$ to be inferred ($x_1^0$ and $x_2^0$ are inputted to the two A-D converters 90A and 90B in sample-hold method. The membership functions for the first rule 1 are selected by select signals ($d_1$) and ($d_2$) outputted from the controller 13. The digital grade signals $gT_1$ and $gT_2$ (e.g. 6 bits) converted by the A-D converters 90A and 90B, respectively in accordance with the antecedent of the rule 1 are supplied to the MIN operation section 62 to select a smaller grade $gT_i$ and then supplied to the defuzzifier 64. Further, an external digital input gT (if any) is inputted to the 6-bit bus. On the other hand, the consequent of the rule 1 is selected by the select signal ($d_3$), and a value $y_i = d_3$ is outputted from the logic circuit 63 to the defuzzifier 64.

Thereafter, the controller 61 designates membership functions for rule 2. In the same way, analog input values $V_{in}(x_i^0)$ are converted into digital values gT and then supplied to the defuzzifier 74. After the two smaller grade values $gT_1$ and $gT_2$ and the two values $y_1$ and $y_2$ have been inputted to the defuzzifier 64, an analog defuzzified value $y_0$ can be calculated as an inferred result in accordance with the averaging equation (1), for instance. In the fuzzy controller shown in FIG. 7(A), it is possible to execute an inference processing even if the number of rules is large, in spite of a simple system configuration. However, the inference speed is relatively low.

FIG. 7(B) shows another fuzzy processor, in which four A-D converters 90A-1, 90B-1, 90A-2 and 90B-2 are provided in such a way that the first rule 1 can be executed by two A-D converters 90A-1 and 90B-1 and the second rule 2 can be executed by two A-D converters 90A-2 and 90B-2 at the same time, to increase the inference processing speed.

Figure 8:
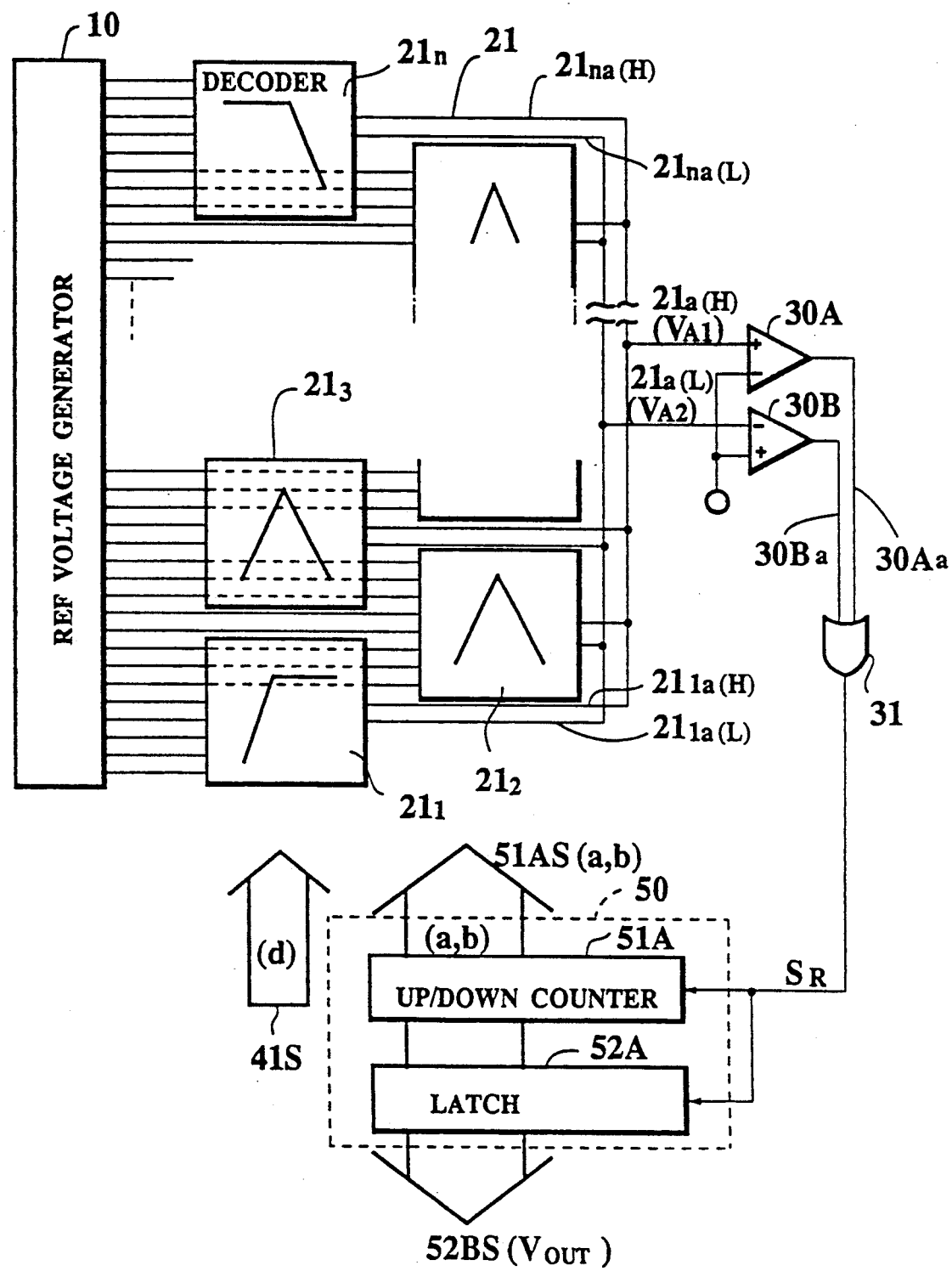
FIG. 8 is a block diagram showing a modification of the A-D converter according to the present invention.

FIG. 8 shows a modification of the A-D converter according to the present invention, in which two negative (upper half) and positive (lower half) gradient sides of a two-valued membership function are divided into two outputs 21a (H) and 21a (L) and connected two comparators 30A and 30B, separately. The two outputs 30Aa and 30Ba of these two comparators 30A and 30B are ORed through an OR gate 31, and an ORed reset signal $S_R$ is supplied to the up/down counter 51A and the latch circuit 52A.

In this embodiment, since the single-valued portion select bit signal (c or c̄) can be omitted, it is possible to reduce the number of decoder signals 51AS into two bits (a, b). In addition, since the two gradient (upper and lower) sides can be compared by the two comparators 30A and 30B simultaneously, it is possible to increase the inference processing speed to about twice that of the processor shown in FIG. 4. Further, when the number of the comparators is increased for providing parallel inference processing, it is possible to further increase the inference speed. However, the number of elements and the power consumption rate increase.

Figure 16:
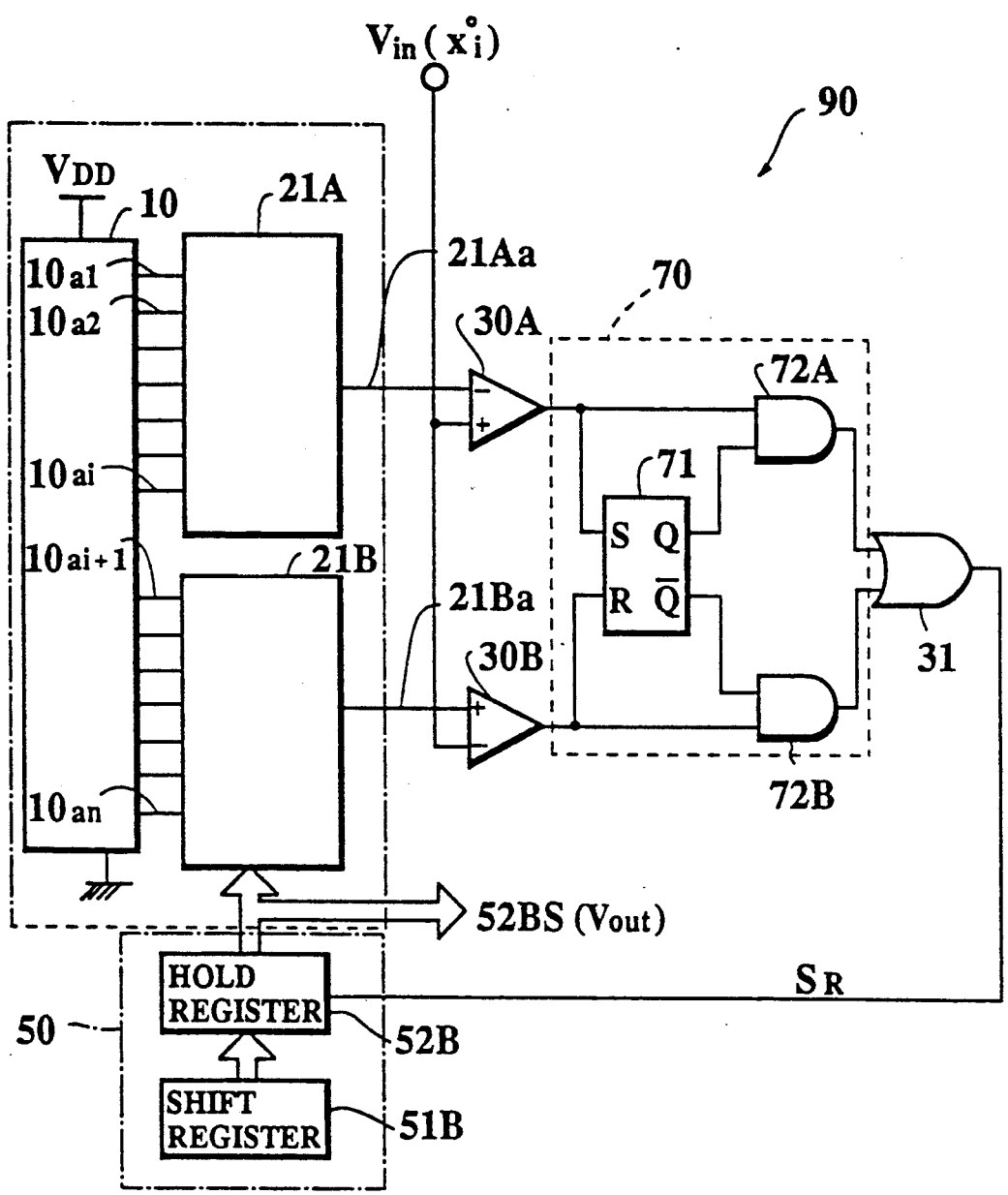
FIG. 16 is a block diagram showing the A-D converter according to the present invention in which a comparator priority decision logic circuit applicable to a two-valued function is incorporated.
Figure 17:
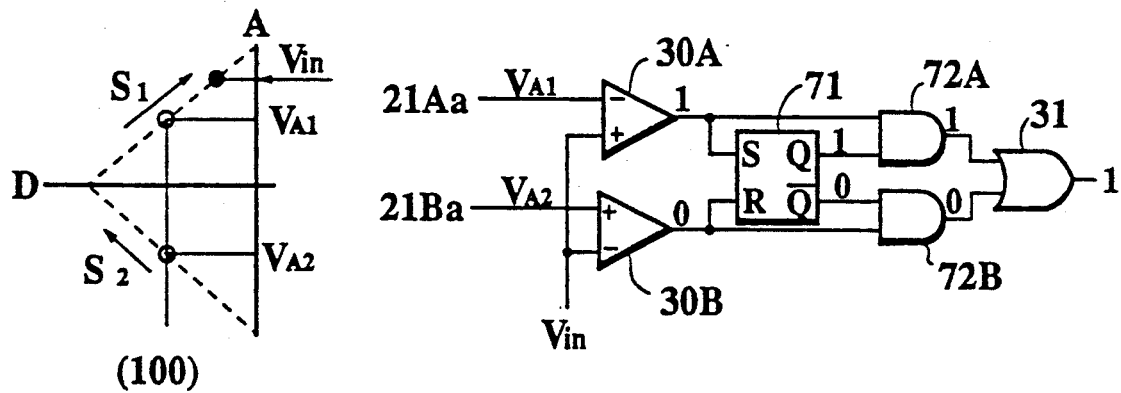
FIGS. 17(A) to (C) are graphical representations showing two-valued triangular membership functions and block diagrams showing the comparator priority decision logic circuits, respectively for assistance in explaining the operation thereof.
Figure 17:
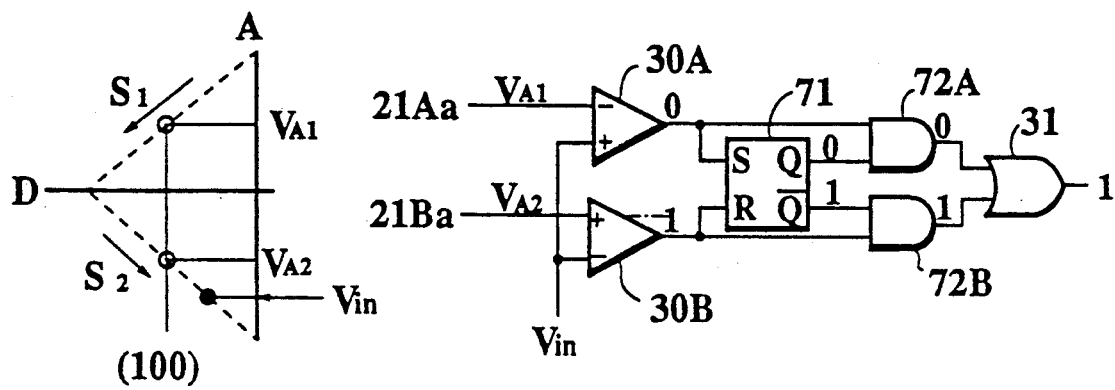
Figure 17:
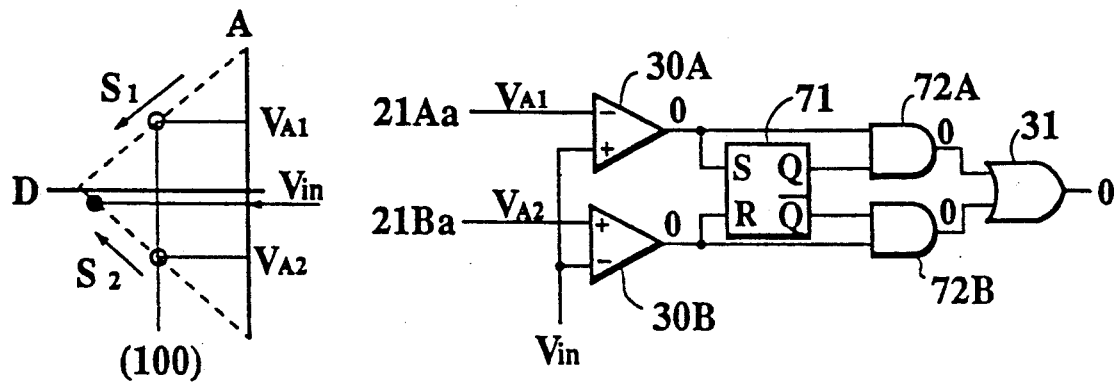
Figure 18:
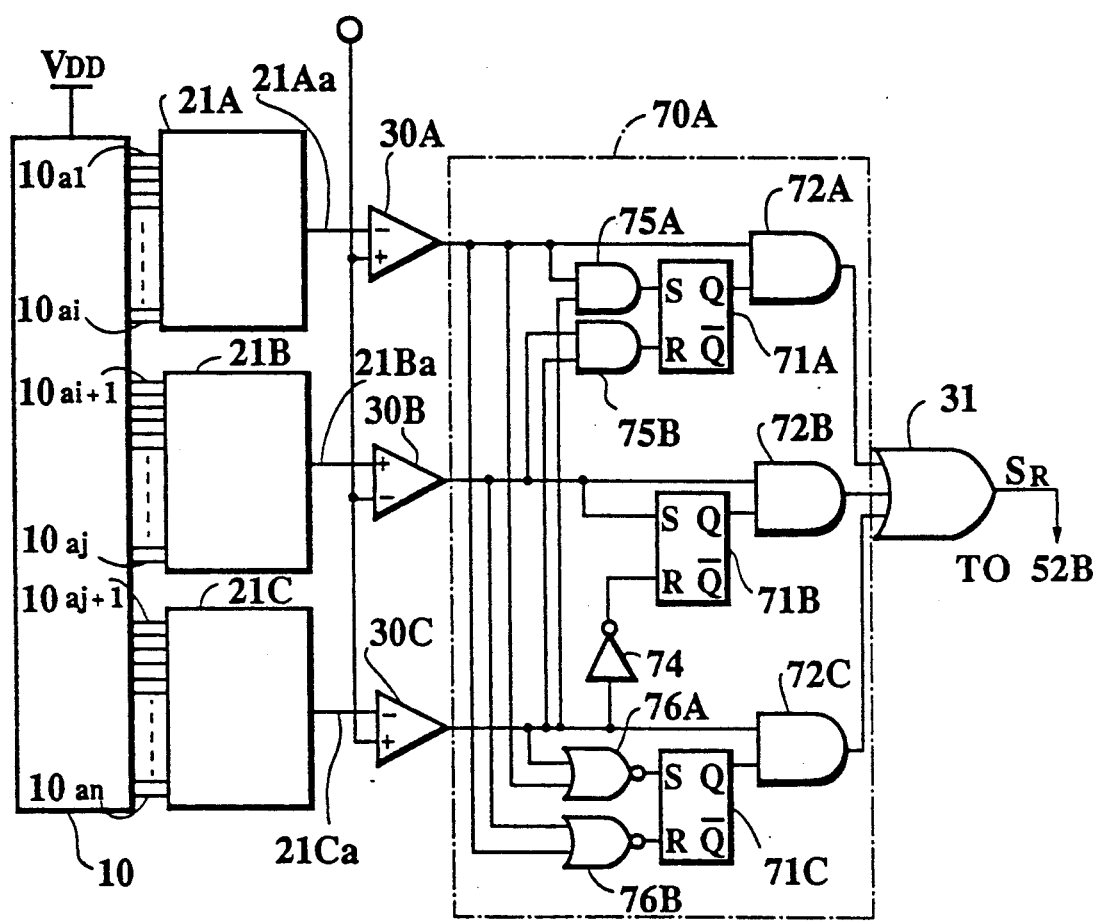
FIG. 18 is a block diagram showing the A-D converter according to the present invention in which a comparator priority decision logic circuit applicable to a three-valued function is incorporated.

Further, the A-D converter shown in FIG. 8 is effective only when a single analog input signal $V_{in}$ is converted into a single digital output signal $V_{out}$ in accordance with a two-valued function. In other words, it is impossible to successively convert $V_{in}$ into $V_{out}$ in accordance with the two-valued function when $V_{in}$ increases or decreases gradually, because this method cannot discriminate the upper and lower sides of the two-valued function. Successive A-D conversion in accordance with a two- or multi-valued function can be executed by the A-D converter including a comparator priority decision logic circuit 70 or 70A as shown in FIG. 16 or 18, which will be described later in further detail.

Figure 3:
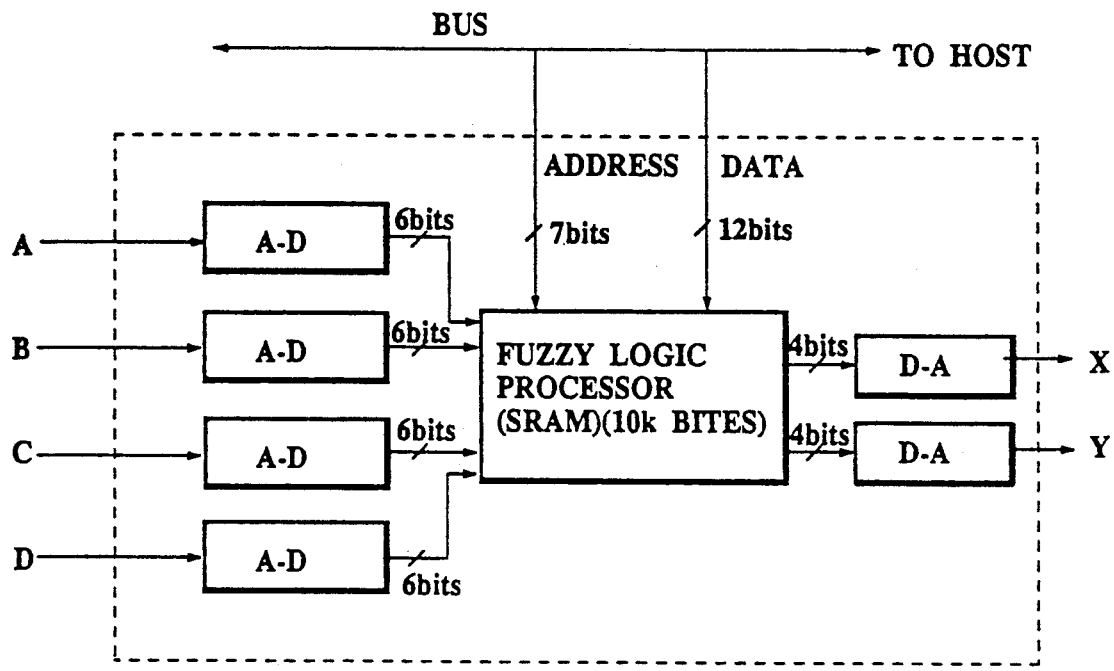
FIG. 3(A) is a block diagram showing a prior-art fuzzy controller.
FIG. 3(B) is a block diagram showing another prior-art fuzzy controller.
Figure 3:
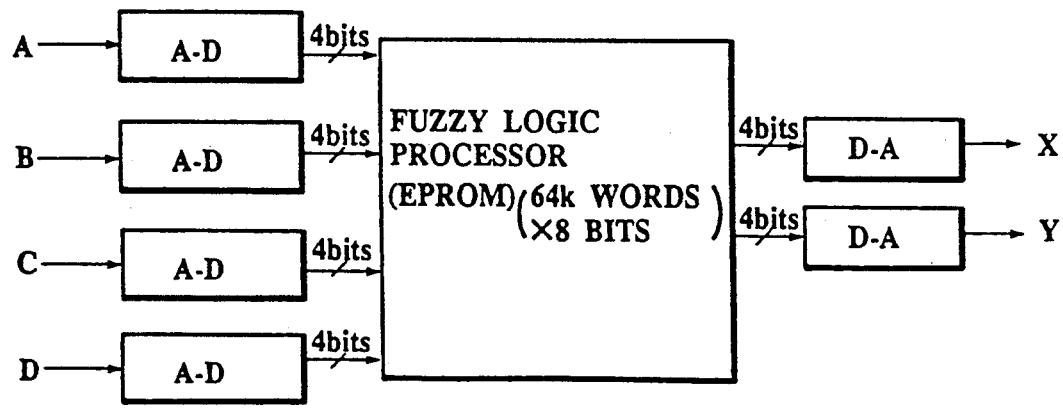

As described above, in the A-D converter accordingly to the present invention, since the analog input values ($V_{in}$) can be automatically converted into digital output (fuzzified grade) values in accordance with membership functions, it is possible to increase the inference processing speed of a fuzzy inference system by the memory access time (the time during which membership functions are read out of the memory), simplify the system configuration, and reduce the power consumption rate, as compared with the prior-art fuzzy processor or chips as shown in FIGS. 3(A) and 3(B).

The reference voltage generator incorporated in the A-D converter according to the present invention will be described hereinbelow with reference the attached drawings.

Figure 9:
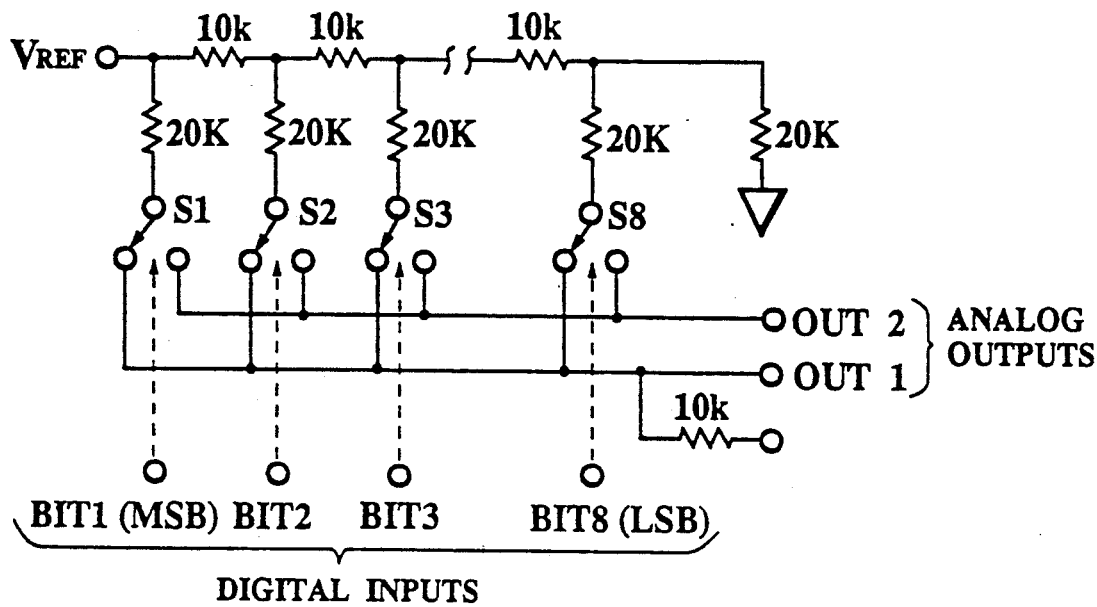
FIG. 9(A) is a circuit diagram showing a prior-art reference voltage generator.
FIG. 9(B) is a list showing the relationship between digital input signals and analog output voltages of the prior-art reference voltage generator shown in FIG. 9(A)

FIG. 9(A) shows an example of prior-art R-2R type reference voltage generators. This reference voltage generator is composed of a plurality of 10 kohm resistors (R), a plurality of 20 kohm resistors (2R), and a plurality of switches (S) turned on or off in response to an 8-bit input signal (BIT1 to BIT8). When an external reference voltage $V_{ref}$ is applied, it is possible to obtain $2^8 = 256$ different analog reference voltages divided by the resistors R and 2R, as listed in FIG. 9(B), between the two outputs OUT1 and OUT2, because the switches S1 to S8 are closed or opened, respectively in response to the 8-bit input signal. The above prior-art reference generator outputs a plurality of analog output voltages by multiplying the external reference voltage $V_{ref}$ by multipliers. Further, when the external reference voltage $V_{ref}$ changes, it is possible to further obtain different analog output voltages. In the above prior-art reference generator, since the analog output voltages are determined on the basis of a simple multiplication function, it is possible to obtain a linear voltage function. However, it is impossible to freely change the shapes of voltage functions. Therefore, where the prior-art reference voltage generator is incorporated in the A-D converters for a fuzzy processor as show in 7(A) and 7(B), there exists a problem in that it is impossible to freely alter the kinds of the membership functions.

Figure 10:
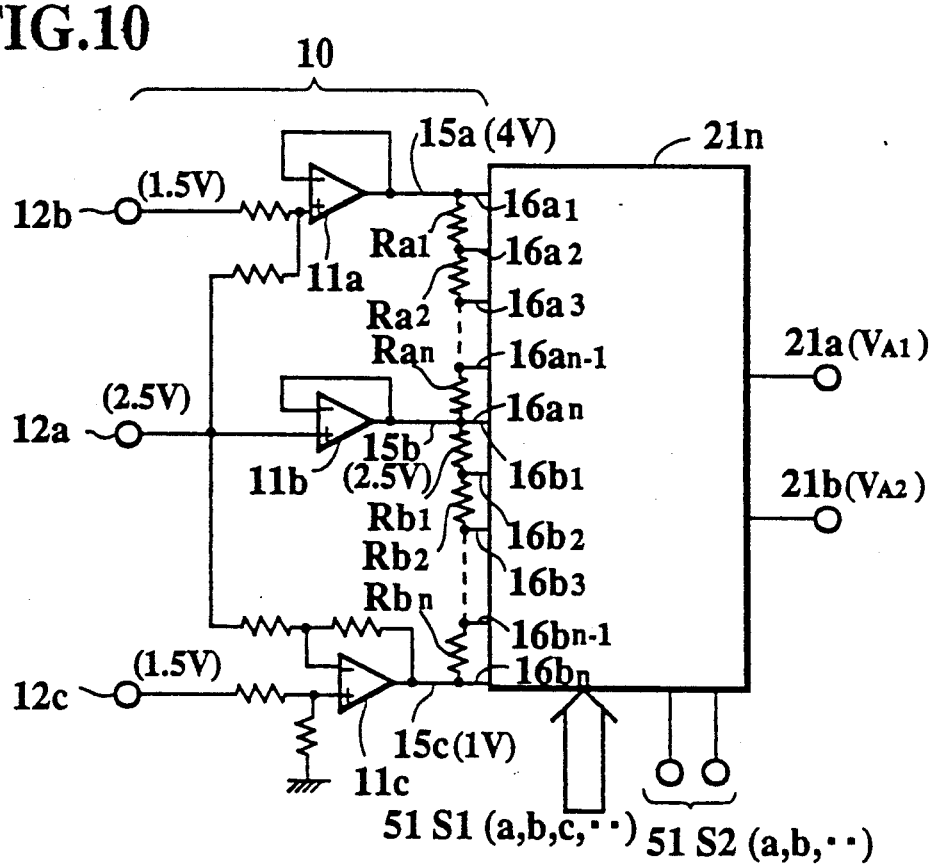
FIG. 10 is a circuit diagram showing a reference voltage generator incorporated in the A-D converter according to the present invention.

FIG. 10 shows an embodiment of the reference voltage generator according to the present invention. This generator can be considered as a D-A converter, because a great number of analog output signal (reference comparison voltages $V_{A1}$ and $V_{A2}$) can be obtained through two output terminals 21a and 21b in response to multibit digital input select signals 51S1 (a, b, c ---) and 51S2 (a, b).

In FIG. 10, three different external reference voltages are applied to three input terminals 12a, 12b and 12c. A middle reference voltage is applied to the middle input terminal 12a. The reference voltage generator shown in FIG. 10 comprises an adder 11a, a buffer 11b, a subtracter 11c, and two groups of series-connected resistors $R_{a1}$ to $R_{an}$ and $R_{b1}$ to $R_{bn}$. A highest reference voltage 15a is obtained by adding the first reference voltage 12a and the second reference voltage 12b through the adder 11a; a middle reference voltage 15b is obtained through the buffer 11b; and a lowest reference voltage 15c is obtained by subtracting the third external reference voltage 12c from the first external reference voltage 12a through the subtracter 11c. The reference voltage between the highest reference voltage 15a and the middle reference voltage 15b is further divided by the series-connected resistors $R_{a1}$ to $R_{an}$, and the reference voltage between the middle reference voltage 15b and the lowest reference voltage 15c is further divided by the series-connected resistors $R_{b1}$ to $R_{bn}$. Therefore, it is possible to obtain a plurality of different divided reference voltages $16_{a1}$ to $16_{an}$ and $16_{b1}$ to $16_{bn}$ ($16_{an} = 16_{b1}$) from each connection point between two resistors $R_{ai}$ or $R_{bi}$.

Figure 11:
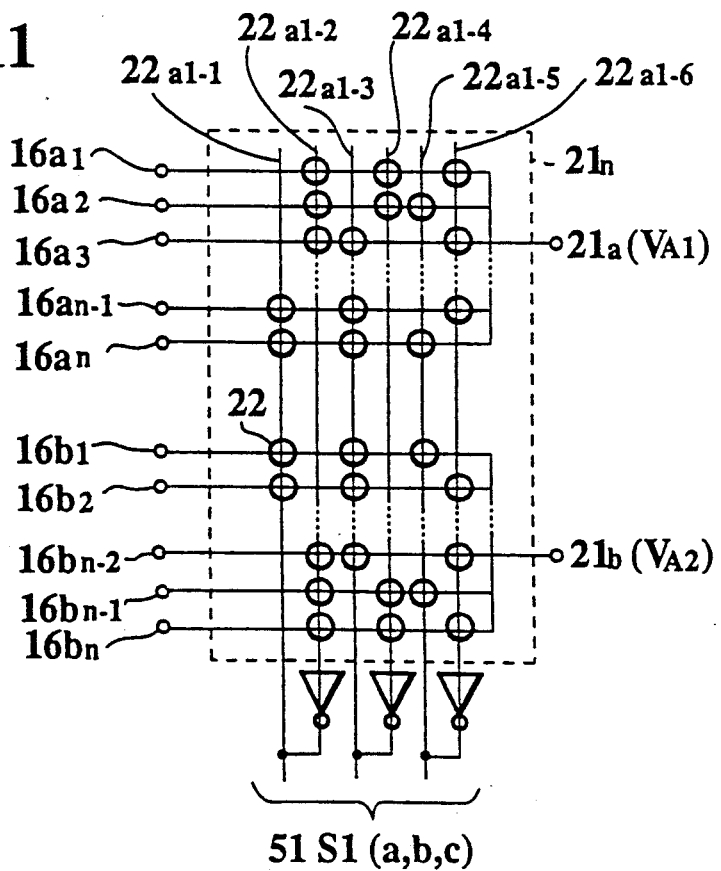
FIG. 11 is a similar illustration showing a decoder switch array block composed of decoder array switches.
Figure 12:
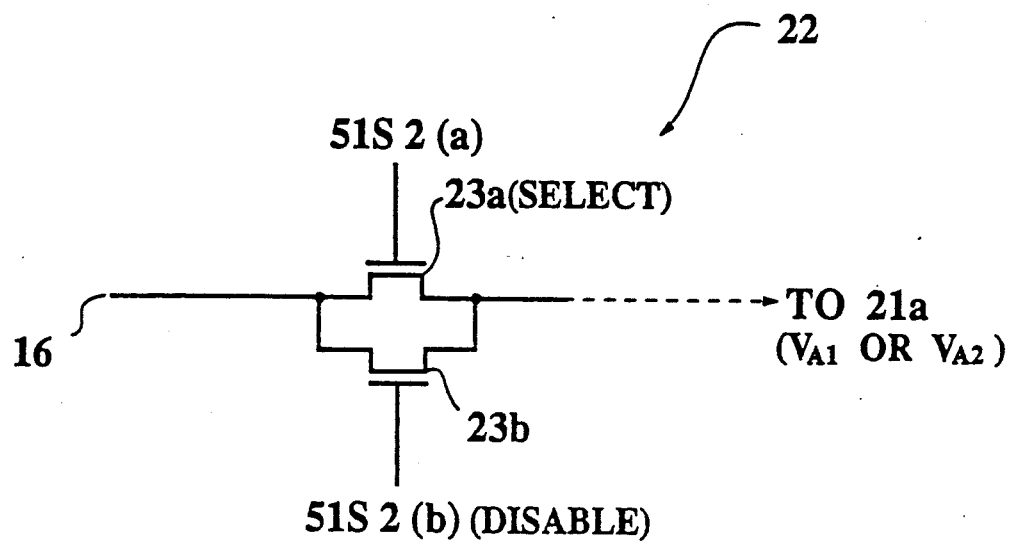
FIG. 12 is a circuit diagram showing an example of a single decoder switch incorporated in the decoder switch array block shown in FIG. 11.
Figure 13:
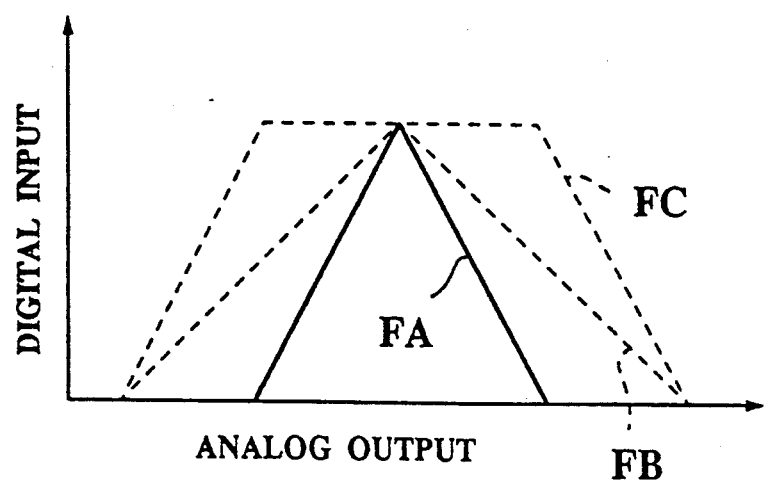
FIG. 13 is a graphical representation showing various two-valued functions alterable by the reference voltage generator shown in FIG. 10 and the decoder switch array block shown in FIG. 11.

These reference voltages $16_{a1}$ to $16_{an}$ and $16_{b1}$ to $16_{bn}$ are applied to a decoder switch array block $21_n$ composed of a number of array switches 22 which can be turned on in response to an m-bit array switch select signal 51S1 (a, b, c, ---). In FIG. 11, when the three array switches $22_{a1\text{-}2}$, $22_{a1\text{-}4}$ and $22_{a1\text{-}6}$ are all turned on in response to the m-bit signal 51S1 (a, b, c), a reference voltage $16_{a1}$ can be selected as an analog output (reference comparison) signal $21_a$ ($V_{A1}$) Here, the intersection points $22_{a1\text{-}1}$, $22_{a1\text{-}3}$ and $22_{a1\text{-}5}$ are all conductive points as described later with reference to FIG. 12. In the same say, a reference voltage $16_{bn}$ can be selected as an analog output signal 21b ($V_{A2}$) in response to the same m-bit digital signal 51S1. This is because a two-valued function as shown by FA in FIG. 13 is taken as an example, where two analog output signals 21a and 21b are obtained in response to the same digital signal 51S1 (a, b, c).

In summary, any desired analog reference comparison voltages $16_{a1}$ to $16_{an}$ and $16_{b1}$ to $16_{bn}$ can be selected in response to the select digital signal 51S1 through the decoder $21_n$ in symmetry.

Further, the positions of these array switches 22 in the decoder $21_n$ can be freely changed in response to an m-bit array select signal 51S2 (a, b, ---) shown in FIG. 10. FIG. 12 shows an example of the array switch 22, which composed of a first transistor 23a turned on or off by one 51S2(a) of the select signals 51S2 and a second transistor 23b turned on or off by one 51S2(b) of the switch disable signals 51S2. Therefore, when the switch disable signal 51S2(b) is set to "1", since the second transistor 28b is kept turned on, this array switch 22 is always conductive and therefore the first transistor 23a is disabled irrespective of "1" or "0" of the select signal 51S2(a). On the other hand, when the switch disable signal 51S2(b) is set to "0", since second transistor 23b is kept turned off, this array switch 22 is operative and therefore the first transistor 23a is turned on or off in response to "1" or "0" of the select signal 51S2(a). The operative array switches 22 are shown by small circles in FIG. 11, and the disabled array switches are shown by intersections of horizontal and vertical lines. As described above, it is possible to freely change the positions at which the array switches 22 are operative.

These divided voltages $16_{a1}$ to $16_{an}$ and $16_{b1}$ to $16_{bn}$ are applied to the decoder 21, and two analog output voltage values are selected as two analog reference comparison voltages $21a(V_{A1})$ and $21b(V_{A2})$ of a two-valued (membership) function, for instance in response to the m-bit select signal 51S1 (a, b, c, ---).

Since the decoder block 21 is composed of a plurality of array switches 22 shown by small circles, when any selected array switches 22 are turned on in response of the m-bit select signals 51S1, it is possible to switch and select a plurality of the reference voltages $16_{a1}$ --- $16_{an}$ or $16_{b1}$ --- $16_{bn}$. These selected analog reference comparison voltages $21a$ ($V_{A1}$) and $21b$ ($V_{A2}$) shown in FIG. 11 correspond to the two reference comparison voltages 21a(H) and 21a(L) in FIG. 8. Further, the positions of the array switches 22 can be freely changed by the m-bit select signals 51S2 (a, b, ---).

The operation of the reference voltage generator 10 according to the present invention will be described in more practical way hereinbelow.

A voltage 2.5 V is applied to the first (middle) terminal 12a and a voltage 1.5 V is applied to the second and third terminals 12b and 12c in FIG. 10. The middle reference voltage 15b (i.e. 2.5 V) can be obtained from the first external reference voltage terminal 12a through the buffer 11b. The highest reference voltage 15a (i.e. 4 V) can be obtained by adding the first and second external reference voltages 2.5 V and 1.5 V through the adder 11a. The lowest reference voltage 15c (i.e. 1 V) can be obtained by subtracting the third external reference voltage (i.e. 1 V) from the first external reference voltage (i.e. 2.5 V). The voltage (1.5 V) between the highest and middle reference voltages 15a (4 V) and 15b (2.5 V) is further divided into a plurality of reference voltages $16_{a1}$ to $16_{an}$ by a plurality of resistors $R_{a1}$ to $R_{an}$. The voltage (1.5 V) between the middle and lowest reference voltages 15b (2.5 V) and 15c (1 V) is further divided into a plurality of reference voltages $16_{b1}$ to $16_{bn}$ by a plurality of resistors $R_{b1}$ to $R_{bn}$.

The above reference voltages $16_{a1}$ to $16_{an}$ and $16_{b1}$ to $16_{bn}$ are applied to the decoder block 21, and any desired two symmetrical analog reference voltages 21a and 21b can be obtained by turning on a series of array switches 22 in response to the m-bit digital signal 51S1.

In the reference voltage generator 10, when the second and third external reference voltages (1.5 V) applied to the second and third terminals 12b and 12c are increased or decreased symmetrically with respect to in first external reference voltage (2.5 V) applied to the first terminal 12a, since only the highest and lowest reference voltages 15a (4 V) and 15c (1 V) can be changed, it is possible to change a triangular membership function shown by FA to that shown by FB in FIG. 13. When the second and third external reference voltages applied to the terminals 12b and 12c are increased or decreased asymmetrically with respect to the first external reference voltage applied to the terminal 12a, it is possible to obtain an asymmetrical triangular membership function (not shown) Further, when the positions of the array switches 22 are changed by selecting the array switch disable signals 51S2(b), it is also possible to obtain a trapezoidal membership function as shown by FC in FIG. 13.

In the above embodiment shown in FIG. 10, three external reference voltages are applied to three input terminals 12a, 12b and 12c of the generator. Without being limited thereto, however, it is also possible to apply four or more external reference voltages to the generator, so as to code a multivalued function in the decoder array block 21n of the decoder 20.

As described above, in the reference voltage generator 10 according to the present invention, it is possible to obtain any desired shape of membership function, by simply changing the external reference voltage values applied to the input terminals, and the changing the array switch positions 22 on the basis of the array switch disable signal 51S2(b). Therefore, when the reference voltage generator 10 is incorporated in a fuzzy controller, it is possible to facilitate tuning of the membership functions.

Figure 1:
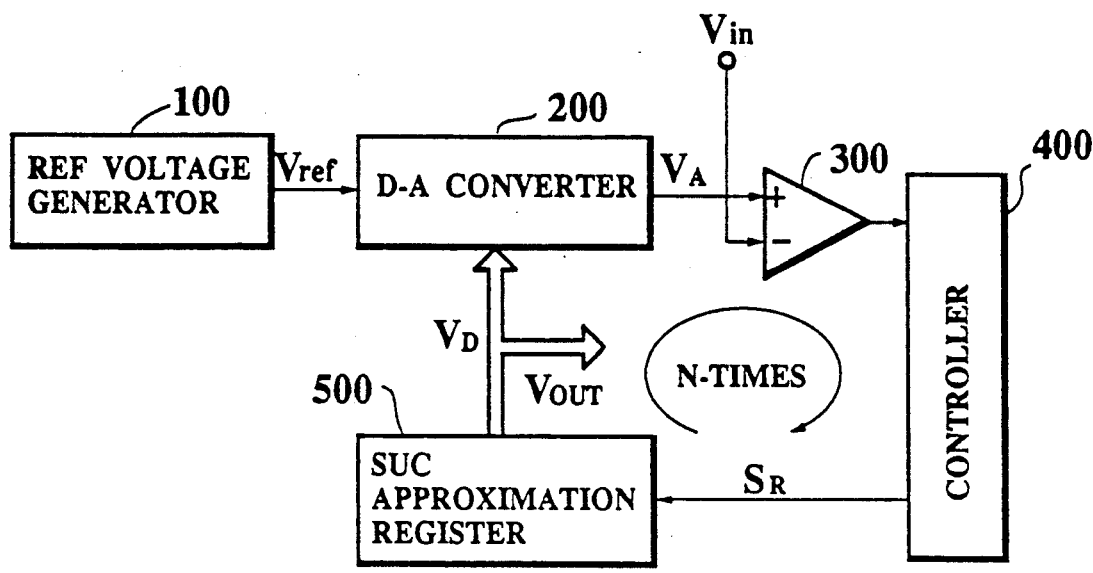
FIG. 1(A) is a block diagram showing a prior-art successive approximation (voltage comparison) A-D converter.
FIG. 1(B) is a block diagram showing a prior-art successive approximation (current comparison) A-D converter.
Figure 1:
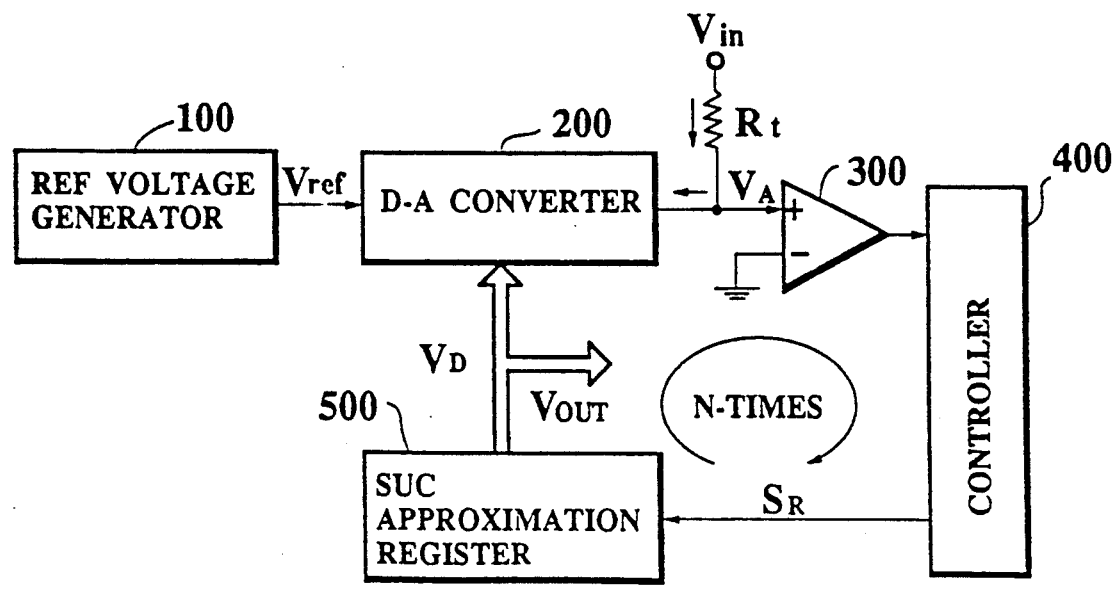
Figure 2:
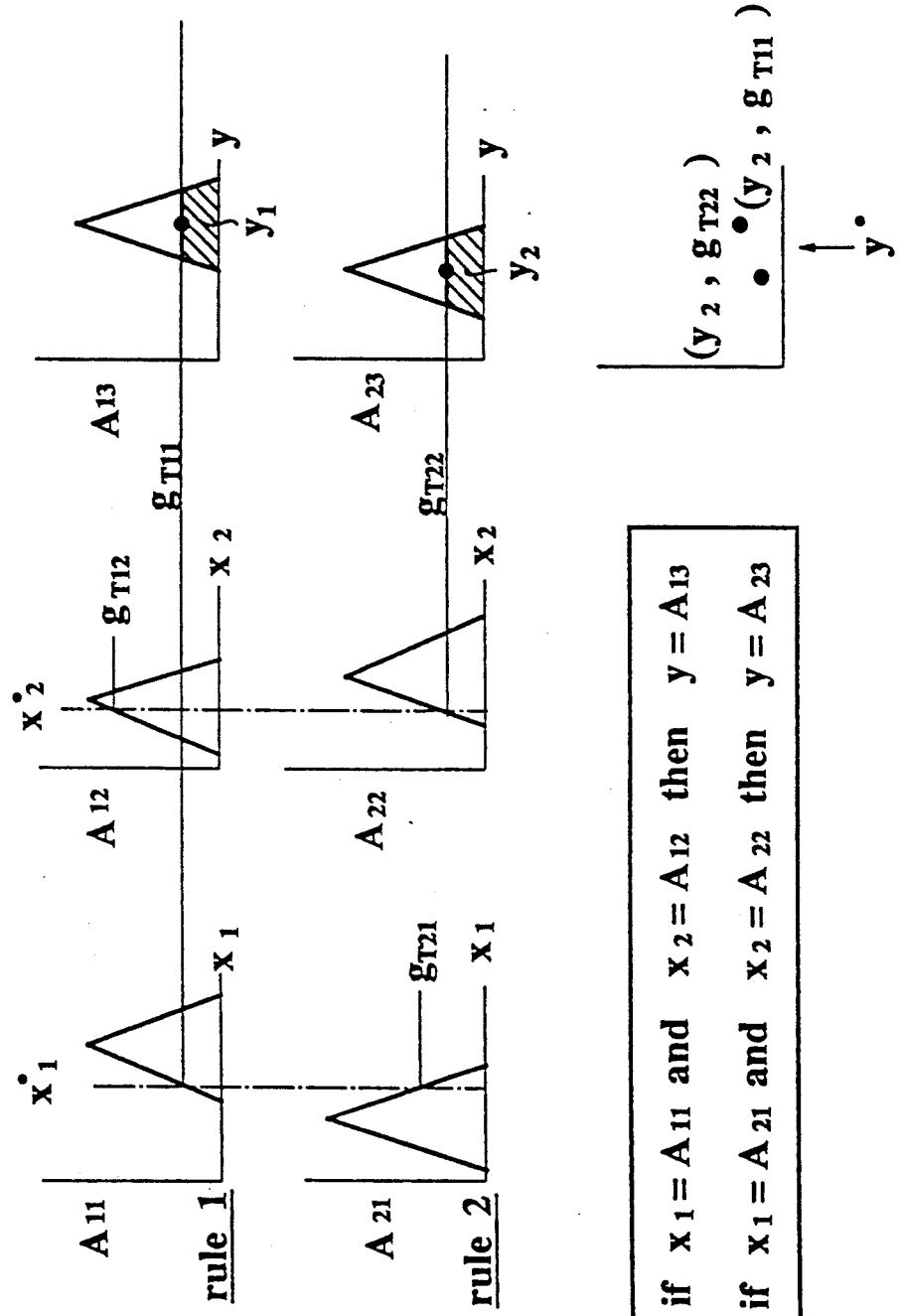
FIG. 2 is graphical illustrations for assistance in explaining prior-art fuzzy inference rules.
Figure 14:
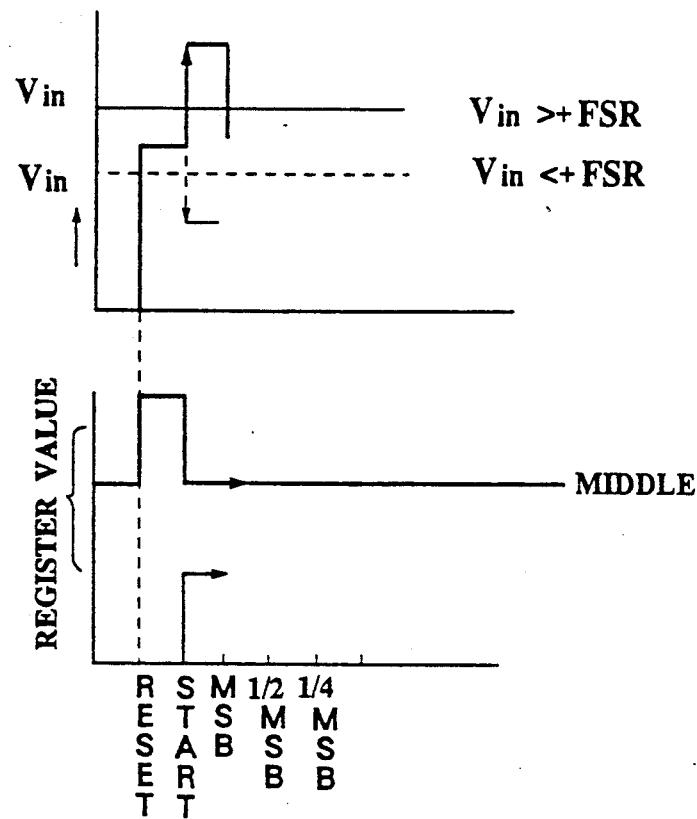
FIG. 14(A) is a timing chart for assistance in explaining the operation of the prior-art successive approximation voltage comparison A-D converter shown in FIG. 1(A)
FIG. 14(B) is a detailed block diagram showing the same prior-art successive approximation voltage comparison A-D converter/shown in FIG. 1(A)
FIG. 14(C) is a table listing the relationship between the analog input voltages ($V_{in}$) and the digital output voltages ($V_{out}$) of the prior-art A-D converter shown in FIG. 14(B)
Figure 14:
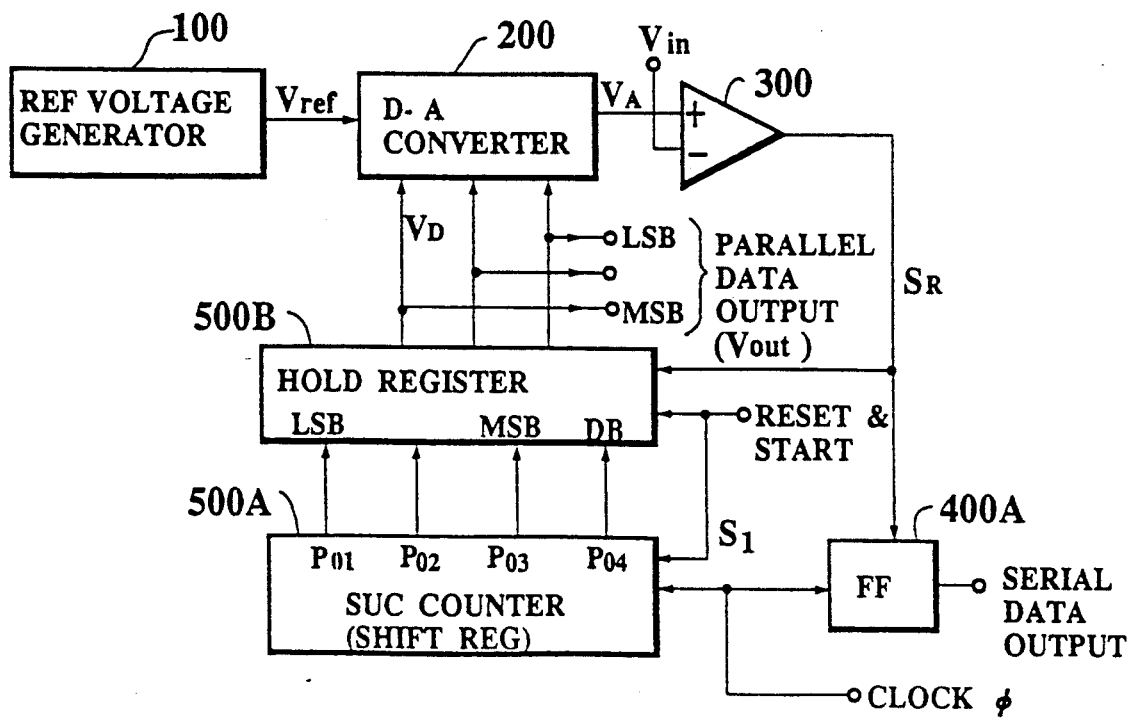

As already described, when a multivalued (e.g. two-valued) function is coded by the decoder as shown in FIG. 5, a single-valued (upper or lower half) portion is selected by a digital signal (c) and the grade value (the reference comparison voltages) VA is increased from (0.0) to (1.1) in the direction $S_1$ or $S_2$. Further, when a multivalued (e.g. two-valued) function is coded by the decoder as shown in FIG. 8, two single-valued portions are decoded simultaneously and the two grade values are compared with the analog input voltage ($V_{in}$) simultaneously. However, the above two methods are applicable only when a single analog input voltage ($V_{in}$) is converted into a corresponding single digital output voltage ($V_{out}$) in accordance with a multivalued function. In other words, when plural analog input voltages ($V_{in}$) are converted into plural output voltages ($V_{out}$) in sequence along a predetermined direction of the multivalued function, it is necessary to further provide a comparator priority decision logic circuit as described hereinbelow. Prior to the description of the comparator priority decision circuit according to the present invention, the prior-art successive approximation A-D converter shown in FIGS. 1(A) and (B) will be described in further detail again hereinbelow, with reference to FIGS. 14(A), (B) and (C). FIG. 14(A) shows a timing chart; FIG. 14(B) shows the same voltage comparison A-D converter in which the successive approximation register 500 is divided into a successive counter (shift register) 500A and a holding register 500B; and FIG. 14(C) shows a table which lists the relationship between analog input voltages ($V_{in}$) an digital output voltages ($V_{out}$) Further, an analog input voltage signal ($V_{in}$) is converted into a three-bit (8 steps) digital voltage signal ($V_{out}$) by way of example.

When a start signal $S_1$ is applied to the shift register 500A, the most significant bit (MSB $P_{03}$ of the shift register 500A, is set to "1" as (100). As the same time, the holding register 500B holds this data (100) of the shift register 500A. Here, the bit $R_{04}$ is a dummy bit used for timing, and the data (100) corresponds to 4/8 (½) of the full scale range (FSR) of the holding register 500B. Further, although (100) indicates that the leftmost bit is the MSB, this MSB ($P_{03}$) is arranged on the rightmost side in the holding register 500B shown in FIG. 14(B).

(1) This data (100) is applied to the D–A converter 200 and further to the comparator 300 as an analog reference comparison voltage $V_A$ which corresponds to the above digital value $V_D$ of 4/8 FSR. Therefore, the comparator 300 compares an analog input voltage $V_{in}$ with this analog reference comparison voltage $V_A$ of 4/8 FSR. If $V_A < V_{in}$ or $V_A - V_{in} < 0$, the comparator 300 outputs a "0" reset signal without changing the data (100) in the holding register 500B. However, if $V_A > V_{in}$ or $V_A - V_{in} > 0$, the comparator 300 outputs a "1" reset signal to reset the MSB from "1" to "0" in the holding register 500B.

(2) Here, if $V_A(4/8 \text{ FSR}) < V_{in}$ or the reset signal $S_R$ is "0" and therefore the holding register value is unchanged, the shift register value (100) is shifted to (010) and therefore the holding register 500B is set to (110) which corresponds to 6/8 FSR to increase the analog comparison voltage $V_A$. Therefore, this data (110) corresponding to 6/8 FSR is applied to the D–A converter 200, and further to the comparator 300 as a higher analog reference comparison voltage $V_A$. The comparator 300 compares the analog input voltage $V_{in}$ with this higher analog voltage $V_A$ (6/8 FSR).

In the same way, if $V_A > V_{in}$ or $V_A - V_{in} < 0$, the comparator 300 outputs a "0" reset signal without changing the holding register value (110), if $V_A > V_{in}$ or $V_A - V_{in} > 0$, the comparator 300 outputs a "1" reset signal. In response to the "0" reset signal, the holding register 500B is kept unchanged, but the shift register 500A is shifted to (111) which corresponds to ⅞ FSR to increase the analog reference comparison voltage $V_A$. Therefore, this data (111) corresponding ⅞ FSR is applied to the D–A converter 200 and further to the comparator 300 as a highest analog reference comparison voltage $V_A$. The comparator 300 compares $V_{in}$ with $V_A = $ ⅞ FSR. If $V_A < V_{in}$ or the reset signal is "0", the data (111) is outputted as $V_{out}$. If $V_A$ (⅞ FSR) $> V_{in}$, the reset signal is "1", the holding register 500B is reset and the data (110) is outputted as $V_{out}$.

Further, if $V_A$ (6/8 FSR) $V_{in}$ the comparator 300 outputs a "1" reset signal to reset the holding register 500B to (101) which corresponds to ⅝ FSR. Therefore, this data (101) is compared with $V_{in}$ by the comparator 300. If $V_A$ (⅝ FSR) $< V_{in}$ or the reset signal is "0", the data (101) is outputted as $V_{out}$. If $V_A$ (⅝ FSR) $> V_{in}$, the data (100) is outputted as $V_{out}$.

(3) On the other hand, if $V_A$ (4/8 FSR) $> V_{in}$ or the reset signal is "1", the holding resistor 500B is set to (010) which corresponds to 2/8 FSR. In the same way, $V_{in}$ is compared with the set $V_A$, the holding register 500B is set to (011) which corresponds to ⅜ FSR or (001) which corresponds to ⅛ FSR. These set voltages $V_A$ are compared with $V_{in}$ by the comparator 300. Therefore, the analog input voltage $V_{in}$ is converted into the digital output voltage $V_{out}$ as listed in FIG. 14(C).

As described above, in the successive approximation voltage comparison A–D converter, the initial analog reference comparison voltage $V_A$ is first set to a medium value (4/8 FSR) and then compared with the input analog voltage $V_{in}$. If $V_A$ (4/8 FSR) $< V_{in}$, $V_A$ is shifted to a higher value (6/8 FSR); if $V_A$ (4/8 FSR) $> V_{in}$, the $V_A$ is shifted to a lower value (2/8 FSR) Further, if the higher value (6/8 FSR) $< V_{in}$, $V_A$ is further shifted to the highest value (⅞ FSR); if the higher value (6/8 FSR) $> V_{in}$ the $V_A$ is further shifted to another higher value (⅝ FSR). Further, if the lower value (2/8 FSR) $> V_{in}$, the $V_A$ is further shifted to the lowest value (⅛ FSR); if the lower value (2/8 FSR) $< V_{in}$, the $V_A$ is further shifted to another lower value (⅜ FSR).

In summary, after the initial analog reference comparison voltage $V_A$ has been set to a medium value (½ FSR), the analog reference comparison voltage $V_A$ is shifted to a higher value when the input signal $V_{in}$ is higher but to a lower value when $V_{in}$ is lower. Therefore, it is possible to effectively convert the analog input voltage $V_{in}$ into the digital output voltage $V_{out}$. Further, the above-mentioned A–D converter is of course operative when the number of bits is more than three.

In the above-mentioned A–D converter, although any given function (linear, non-linear (e.g. logarithm), etc.) can be applied to the D–A converter 200, it should be noted that a single digital value corresponds to a single analog value. In the case of the fuzzy controller, however, since analog values are converted into digital values in accordance with various membership functions such as multivalued functions, there exist cases where a plurality of analog values correspond to a single digital value as shown in FIGS. 6(A) and (B).

Figure 15:
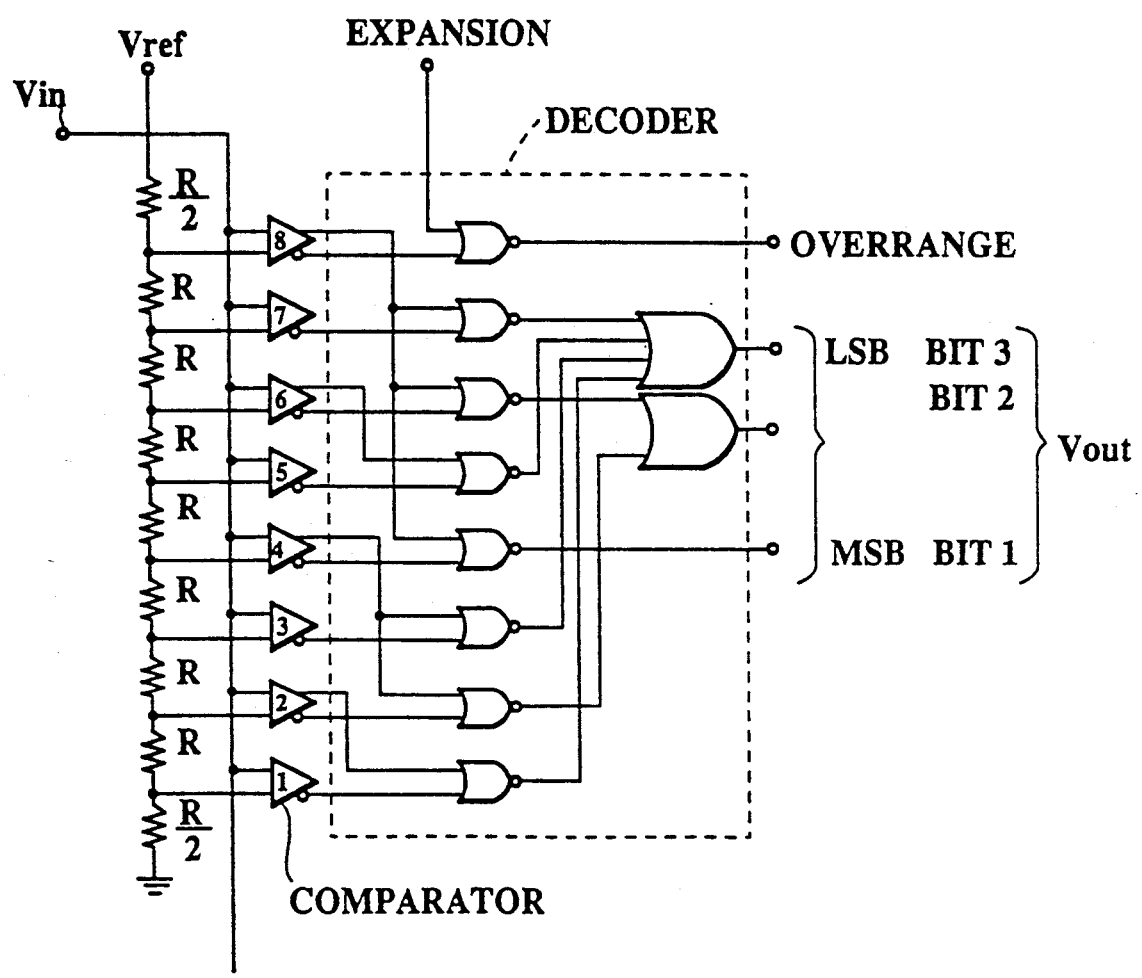
FIG. 15 is a block diagram showing a prior-art parallel arranged voltage comparison type A-D converter.

As a prior-art A–D converter adopted for these multivalued functions, parallel-arranged flash comparison type A–D converter as shown in FIG. 15 is known. In this prior-art A–D converter, however, since $2^n$-piece comparators and NAND gates are required for n-bit digital signals, there exists a problem in that an extremely large chip area is required and therefore the power consumption rate increases, so that it is impossible to incorporate this flush-type A–D converter in a microcomputer chip.

FIG. 16 shows an embodiment of a comparator priority decision logic circuit 70 incorporated in the A–D converter 90 according to the present invention.

In the drawing, the reference voltage generator 10 generates a plurality of reference comparison voltages $10_{a1}$ to $10_{an}$ lying between $V_{DD}$ and zero, as shown in FIG. 16. The decoder 21 is divided into a first decoder switch array block 21A which corresponds to the upper half of a triangular function m as shown in FIG. 5 and a second decoder switch array block 21B which corresponds to lower half thereof. Therefore, a single digital value corresponds to single analog value in each decoder switch array block 21A or 21B; however, a single digital value corresponds to two analog values in these two decoder switch array blocks 21A and 21B.

The first output $21A_a$ of the first decoder switch array block 21A is connected to an inversion input terminal (−) of the first comparator 30A, and the second output $21B_a$ of the second decoder switch array block 21B is connected to a non-inversion input terminal (+) of the second comparator 30B. An input analog signal $V_{in}(x_i)$ is applied to a non-inversion terminal (+) of the first comparator 30A and an inversion input terminal of the second comparator 30B.

The comparator priority decision logic-circuit 70 comprises a RS flip-flop 71, and first and second AND gates 72A and 72B. This logic circuit 70 selects or decides the comparator outputs to be A–D converted first. The reset signal $S_R$ from the OR gate 31 is applied to a successive approximation register 50 composed of a successive counter or a shift register 51B (which corresponds to an up/down counter 51 shown in FIG. 4) and a hold register 52B (which corresponds to a latch circuit 52 shown in FIG. 4). Further, the successive approximation register 50 is controlled by a timing circuit and a microcomputer (both not shown). Further, output signals 52BS ($V_{out}$) of the hold register 52B are converted digital output signals corresponding to the analog input signals $V_{in}$ ($X_1^o$).

The operation of the A–D converter 90 will be described hereinbelow with reference to FIGS. 16 and 17(A) to (C).

A plurality of comparison voltages are supplied to the decoder switch array blocks 21A and 21B and decoded (selected) on the basis of digital signals 52BS applied by the hold register 52B in the same way as already explained with reference to FIGS. 5, 11 and 12.

In FIG. 17(A) to (C), left side triangulars indicate a membership function where the abscissa indicates digital value D and the ordinate indicates analog value A, which corresponds to the graph shown in FIG. 5 or 6. As already described, the upper half function is coded in the first decoder switch array block 21A and the lower half function is coded in the second decoder switch array block 21B.

In the same way as with the prior-art A–D converter shown in FIG. 14(B), the most significant bit (MSB) is set to "1" in the shift register 51B when started, and then transferred to the hold register 52B. That is, the hold register 52B is set to (100). Since this digital signal (100) corresponds to a middle value ($\frac{1}{2}$ FSR) of the 3-bit signal (See FIG. 14(C)), when this digital signal (100) is applied to the two decoder switch array blocks 21A and 21B, these decoder switch array blocks 21A and 21B decode these middle analog reference comparison voltages $V_{A1}$ and $V_{A2}$ as shown by small white dots in FIG. 17, respectively.

With reference to FIG. 17(A), when the input analog voltage $V_{in}$ (shown by a black dot) is higher than the middle comparison value $V_{A1}$ (shown by a white dot), since $V_{in} > V_{A1}$ or $V_{in}$ (+terminal)$-V_{A1}$ (−terminal)$>0$, the first comparator 30A outputs a "1" signal. On the other hand, since $V_{in} > V_{A2}$ or $V_{A2}$ (+terminal) $-V_{in}$ (−terminal)$<0$, the second comparator 30B outputs a "0" signal. Therefore, the SR flip-flop 71 is set to outputs Q="1" and $\bar{Q}$="0" signal, respectively. The first AND gate 72A outputs a "1" signal and therefore the OR gate 31 outputs a "1" reset signal (SR="1") to the hold register 52B. In this case, therefore, the upper half function has a priority over the lower half function, so that the successive approximation operation is kept executed only through the first comparator 30A. As already explained, the analog reference comparison signal $V_{A1}$ is increased to the input comparison signal $V_{in}$ in the direction S1 (because $V_{A1} < V_{in}$) and then in the direction S2.

With reference to FIG. 17(B), when the input analog voltage $V_{in}$ (shown by a black dot) is lower than the middle reference comparison value $V_{A2}$ (shown by a white dot), since $V_{A2} > V_{in}$ or $V_{A2}$ (+terminal)$-V_{in}$ (−terminal)$>0$, the second comparator 30B outputs a "1" signal. On the other hand, since $V_{in} < V_{A1}$ or $V_{in}$ (+terminal) $V_{A1}$ (−terminal)$<0$, the first comparator 30A outputs a "0" signal. Therefore, SR flip-flop 71 is reset to outputs Q="0" and $\bar{Q}$="1" signal, respectively. The second AND gate 72B outputs a "1" signal and therefore the OR gate 31 outputs a "1" reset signal (SR="1") to the hold register 52B. In this case, therefore, the lower half function has a priority over the upper half function, so that the successive approximation operation is kept executed only through the second comparator 30B. As already explained, the analog reference comparison signal $V_{A2}$ is decreased to the input signal $V_{in}$ in the direction S2 (because $V_{A2} > V_{in}$) and then in the direction S1.

With reference to FIG. 17(C), when the input analog voltage $V_{in}$ (shown by a black dot) lies between the two middle reference comparison values $V_{A1}$ and $V_{A2}$ (shown by two white dots), since $V_{A1} > V_{in} > V_{A2}$ or $V_{in}$ (+terminal) $-V_{A1}$ (−terminal)$<0$ in the first comparator 30A and $V_{A2}$ (+terminal)$-V_{in}$ (−terminal)$<0$ in the second comparator 30B, both the two comparators 30A and 30B output a "0" signal, respectively. Therefore, no priority can be decided and therefore no reset signal $S_R$ is applied to the hold register 52B. However, the shift register 51B is shifted, the analog reference comparison signal $V_{A1}$ is decreased to the analog input $V_{in}$ in the direction S1 and also the analog comparison signal $V_{A2}$ is increased to the analog input $V_{in}$ in the direction S2. In this case, since the $V_{A2}$ first exceeds $V_{in}$, the second comparator 30B first outputs a "1" signal and therefore the successive operation direction S2 is reversed as shown in FIG. 17(B); that is, the lower half function and the second comparator 30B have a priority.

As described above, it is possible to execute the A–D conversion operation in sequence in accordance with a two-valued function.

FIG. 18 shows another modification of a comparator priority decision logic circuit 70A when analog input signals $V_{in}$ are converted into digital output signals $V_{out}$ in accordance with a three-valued function. The decision logic circuit 70A comprises three SR flip-flops 71A, 71B and 71C, three AND gates 72A, 72B and 72C, an inverter 74 connected between the third comparator 30C and the second SR flip-flop 71B, two AND gates 75A and 75B connected between the first, second and third comparators 30A, B and C and the first SR flip-flop 71A, and two OR gates 76A and 76B connected between the three comparators 30A, B and C and the third SR flip-flop 71C.

This comparator priority decision logic circuit 70A also operates substantially in the same way as that 70 shown in FIG. 16. That is, a function or a comparator to which an analog input $V_{in}$ is currently applied is selected. Further, when no function or no comparator can be selected, the inversion of comparator operation direction is detected and the successive operation is executed from the detected single-valued portion of a three-valued function or the comparator.

Further, it is course possible to apply the comparator priority decision logic circuit according to the present invention to a four or more multivalued function.

As described above, in the comparator priority decision logic circuit according to the present invention, when analog input signals are converted into digital output signals in accordance with a multivalued function, it is possible to execute a successive conversion operation by providing a plurality of decoder switch array blocks and comparators (whose numbers are the same as that of the multivalues) and a logic circuit for selecting priority of a comparator or for detecting inversion of a successive operation direction. Therefore, it is possible to reduce the number of circuit elements and the power consumption rate, and to increase the operation speed as compared with the prior-art parallel-arranged (flush) comparison type A–D converter as shown in FIG. 15.

What is claimed is:

1. An analog-to-digital converter, comprising:
   (a) reference voltage generating means for generating a plurality of different analog reference comparison voltages;
   (b) decoder means connected to said reference voltage generating means and including at least one decoder block composed of plural array switches, for decoding a non-linear function coded by an arrangement of array switches to output the analog reference comparison voltages in response to digital signals in accordance with the coded function;
   (c) at least one comparator means connected to said decoder means, for comparing the outputted analog reference comparison voltage with a voltage of an analog input signal to be converted and outputting a reset signal when the analog reference comparison voltage is substantially equal to the analog input signal voltage; and
   (d) approximation register means connected to said at least one comparator and to said decoder means, for successively outputting the digital signals to said decoder means to successively output the different analog reference comparison voltages to said comparator in accordance with the non-linear function and for outputting an A-D converted signal in response to the reset signal from said comparator, whereby the digital signals corresponding to the analog signals can be obtained in accordance with the at least one non-linear function by selectively switching the array switches of said decoder means in response to the digital signals outputted from said approximation register means.

2. The analog-to-digital converter of claim 1, wherein said reference voltage generating means comprises:
   (a) at least three reference voltage input terminals for supplying first, second and third reference voltages;
   (b) an adder for adding the first and second reference voltages supplied through said first and second input terminals to supply a highest reference voltage;
   (c) a buffer for directly supplying the second reference voltage;
   (d) a subtracter for subtracting the third reference voltage from the second reference voltage to supply a lowest reference voltage;
   (e) a first series-connected voltage dividing resistors connected between two outputs of said adder and said buffer, for supplying a plurality of analog reference comparison voltages; and
   (f) a second series-connected voltage dividing resistors connected between two outputs of said buffer and said subtracter, for supplying a plurality of different analog reference comparison voltages in symmetrical voltage distribution relationship with respect to the second reference voltage.

3. The analog-to-digital converter of claim 1, wherein said decoder means including at least one decoder switch array block comprises:
   (a) first parallel-arranged lines connected to different analog reference comparison voltages, respectively;
   (b) second parallel-arranged lines intersecting said first parallel-arranged lines and connected to said approximation register means to input the plural digital signals; and
   (c) decoder switches arranged at predetermined intersections between said first and second lines, for outputting different analog reference comparison voltages in accordance with the coded function when said decoder switches are turned on in response to the digital signals from said approximation register means.

4. The analog-to-digital converter of claim 1, wherein said decoder means includes a plurality of decoder switch array blocks for coding a plurality of different functions, each function being selected by a block select digital signal outputted from a controller.

5. The analog-to-digital converter of claim 1, wherein said decoder means codes a multivalued function for outputting multivalued analog reference comparison voltages in response to a single digital signal, each single-valued portion of the multivalued function being selected in response to an additional digital signal outputted from said approximation register means.

6. The analog-to-digital converter of claim 5, wherein said comparator means comprises a plurality of comparators each for comparing analog reference comparison voltage decoded in accordance with a single-valued portion of a multivalued function with an analog input signal, an OR gate being further connected to said plural comparators to output an ORed reset signal to said approximation register means.

7. The analog-to-digital converter of claim 6, wherein said comparator comprises a first comparator for comparing the analog reference comparison voltage decoded in accordance with a first half of a coded two-valued function with an analog input signal; and a second comparator for comparing the decoded analog reference comparison voltage decoded in accordance with a second half of the same coded two-valued function with the analog input signal; an OR gate being further connected to said first and second comparators to output an ORed reset signal to said successive approximation register means.

8. The analog-to-digital converter of claim 6, which further comprises a comparator priority decision logic circuit connected between said plural comparators and said OR gate, for deciding a priority among said plural comparators on the basis of output signals from said plural comparators, when plural analog input signals are converted in sequence into digital output signals in accordance with a multivalued function.

9. The analog-to-digital converter of claim 8, wherein said comparator priority decision logic circuit is connected between said first and second comparators and said OR gate, for deciding a priority between said first and second comparators on the basis of output signals from said two comparators, when plural analog input signals are converted in sequence into digital output signals in accordance with a two-valued function.

10. The analog-to-digital converter of claim 9, wherein said comparator priority decision logic circuit comprises:
    (a) a SR flip-flop having a set terminal connected to an output of said first comparator and a reset terminal connected to an output of said second comparator;
    (b) a first AND gate for ANDing the output terminal signal of said first comparator and a set output terminal of said SR flip-flop; and
    (c) a second AND gate for ANDing the output terminal signal of said second comparator and a reset output terminal of said SR flip-flop.

11. The analog-to-digital converter of claim 8, wherein said approximation register means comprises:

(a) a shift register for shifting a bit of digital signal in sequence; and
(b) a hold register connected to said OR gate and said shift register, for generating higher digital signals to said decoder means in response to a "0" reset signal obtained when the analog input signal is higher than the reference comparison voltage by shifting a digital signal bit of said shift register, and lower digital signal to said decoder means in response to a "1" reset signal obtained when the analog input signal is lower than the reference comparison voltage by resetting a most significant bit of said hold register.

12. The analog-to-digital converter of claim 1, wherein an intersection of the array switches of said decoder means is provided with parallel-connected first and second switching elements; when the first switching element is kept turned on in response to a first digital signal the intersection is kept closed and therefore the second switching element is disabled; and when the first switching element is kept turned off in response to the first digital signal, the intersection is kept open and therefore the second switching element is enabled so as to be turned on or off in response to a second digital signal.

13. The analog-to-digital converter of claim 1, wherein said approximation register means comprises:
(a) a counter connected to said comparator means, for counting and outputting the digital signal to said decoder means, said counter being reset in response to the reset signal from said comparator; and
(b) latch circuit connected to said counter means and said comparator means, for latching the counted and outputted digital signal in response to the reset signal as a digital output signal.

* * * * *